(12) United States Patent
Duerr et al.

(10) Patent No.: US 12,054,384 B2
(45) Date of Patent: Aug. 6, 2024

(54) MEMS COMPRISING A MOVABLE STRUCTURAL ELEMENT, AND MEMS ARRAY

(71) Applicant: Fraunhofer-Gesellschaft zur Foerderung der angewandten Forschung e.V., Munich (DE)

(72) Inventors: Peter Duerr, Dresden (DE); Andreas Neudert, Dresden (DE)

(73) Assignee: Fraunhofer-Gesellschaft zur Foerderung der angewandten Forschung e. V., Munich (DE)

( * ) Notice: Subject to any disclaimer, the term of this patent is extended or adjusted under 35 U.S.C. 154(b) by 741 days.

(21) Appl. No.: 16/950,782

(22) Filed: Nov. 17, 2020

(65) Prior Publication Data

US 2021/0061642 A1   Mar. 4, 2021

Related U.S. Application Data

(63) Continuation of application No. PCT/EP2019/061969, filed on May 9, 2019.

(30) Foreign Application Priority Data

May 17, 2018   (DE) ..................... 10 2018 207 783.5

(51) Int. Cl.
  *G02B 26/08*   (2006.01)
  *B81B 3/00*   (2006.01)
  *H02N 1/00*   (2006.01)

(52) U.S. Cl.
  CPC ........ *B81B 3/0051* (2013.01); *G02B 26/0841* (2013.01); *H02N 1/008* (2013.01);
  (Continued)

(58) Field of Classification Search
  CPC ............ B81B 3/0051; B81B 2201/033; B81B 2201/042; B81B 2203/0163;
  (Continued)

(56) References Cited

U.S. PATENT DOCUMENTS

| 4,566,935 | A |   | 1/1986 | Hornbeck |
| 5,629,951 | A | * | 5/1997 | Chang-Hasnain ..........................  G02B 26/0841 372/20 |

(Continued)

FOREIGN PATENT DOCUMENTS

| CA | 2482163 A1 | 3/2005 |
| CN | 1502153 A | 6/2004 |

(Continued)

OTHER PUBLICATIONS

Dürr, Peter, et al., "Micro-Actuator With Extended Analog Deflection at Low Drive Voltage", Proceedings of SPIE vol. 6114, 61140l-1, 10 pp.

(Continued)

*Primary Examiner* — Euncha P Cherry
(74) *Attorney, Agent, or Firm* — Perkins Coie LLP; Michael A. Glenn

(57) ABSTRACT

A MEMS includes a substrate with a substrate extension that rises above a substrate plane. The MEMS includes a movable structural element, a first spring element that mechanically connects the movable structural element to the substrate extension, and a second spring element that mechanically connects the movable structural element to the substrate extension. The first spring element and the second spring element form a parallelogram guide of the movable structural element in relation to the substrate extension.

36 Claims, 10 Drawing Sheets

(52) U.S. Cl.
CPC ... *B81B 2201/033* (2013.01); *B81B 2201/042* (2013.01); *B81B 2203/0163* (2013.01)

(58) Field of Classification Search
CPC ........ B81B 2203/053; B81B 2207/053; G02B 26/0841; H02N 1/008
See application file for complete search history.

(56) References Cited

U.S. PATENT DOCUMENTS

| | | |
|---|---|---|
| 6,329,738 B1 | 12/2001 | Hung et al. |
| 6,445,484 B1 | 9/2002 | Miyajima et al. |
| 6,691,571 B2 | 2/2004 | Willig et al. |
| 6,701,039 B2 | 3/2004 | Bourgeois et al. |
| 10,807,859 B2 | 10/2020 | Dürr et al. |
| 2001/0012739 A1 | 8/2001 | Grube et al. |
| 2003/0117687 A1 | 6/2003 | Murakami et al. |
| 2003/0227114 A1 | 12/2003 | Jeong |
| 2004/0151214 A1 | 8/2004 | Syms |
| 2007/0121192 A1 | 5/2007 | Lee et al. |
| 2008/0130090 A1 | 6/2008 | Aubuchon |
| 2009/0015903 A1 | 1/2009 | Bang et al. |
| 2009/0250853 A1 | 10/2009 | Wolter et al. |
| 2012/0038927 A1 | 2/2012 | Matsuda et al. |
| 2015/0036203 A1 | 2/2015 | Nitsche et al. |
| 2017/0297897 A1 | 10/2017 | Duerr et al. |

FOREIGN PATENT DOCUMENTS

| | | |
|---|---|---|
| CN | 101029965 A | 9/2007 |
| CN | 101426717 A | 5/2009 |
| CN | 104011583 A | 8/2014 |
| DE | 10108198 A1 | 9/2002 |
| DE | 60002121.1 T2 | 5/2003 |
| DE | 60213051.4 T2 | 8/2006 |
| DE | 20122618 U1 | 11/2006 |
| DE | 102012200124 A1 | 7/2013 |
| DE | 102015200626.3 B3 | 7/2016 |
| JP | H06289310 A | 10/1994 |
| JP | 2000028937 A | 1/2000 |
| JP | 2013171219 A | 9/2013 |
| WO | 0212925 A2 | 2/2002 |

OTHER PUBLICATIONS

Gehner, Andreas, et al., "MEMS Analog Light Processing—An Enabling Technology For Adaptive Optical Phase Control", Proceedings of SPIE vol. 6113, 61130K-1, 15 pp.

López, D., et al., "Two-Dimensional MEMS Array For Maskless Lithography and Wavefront Modulation", Proceedings of SPIE vol. 6589, 658905, 9 pp.

Stahl, Richard, et al., "Modular Sub-Wavelength Diffractive Light Modulator For High Definition Holographic Displays", Journal Of Physics: Conference Series 415 012057, 7 pp.

* cited by examiner

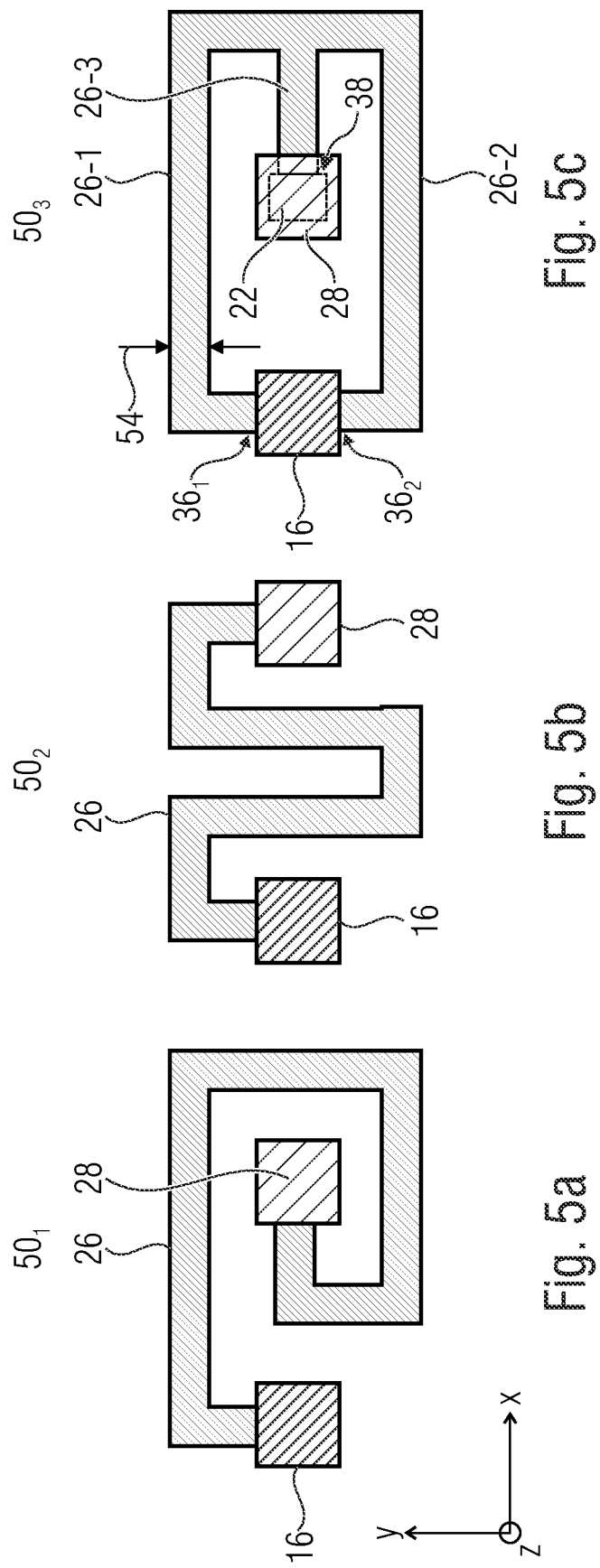

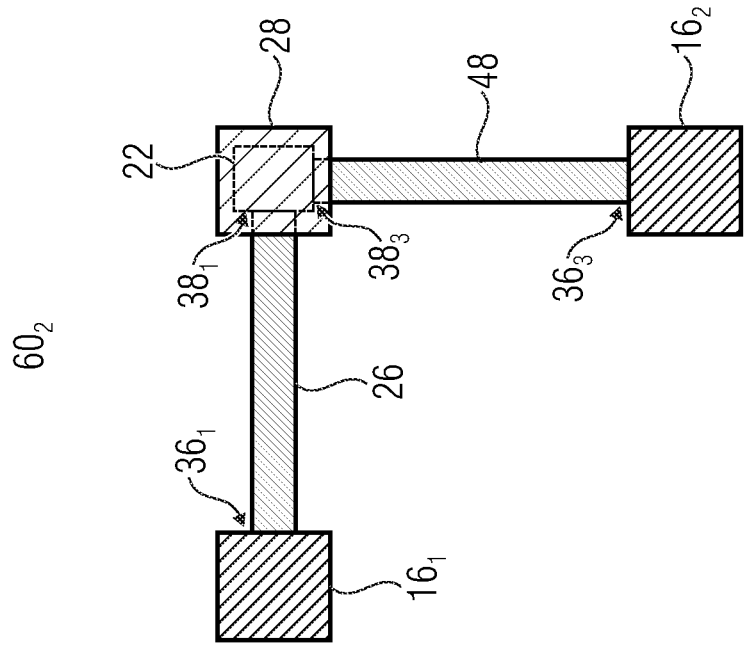
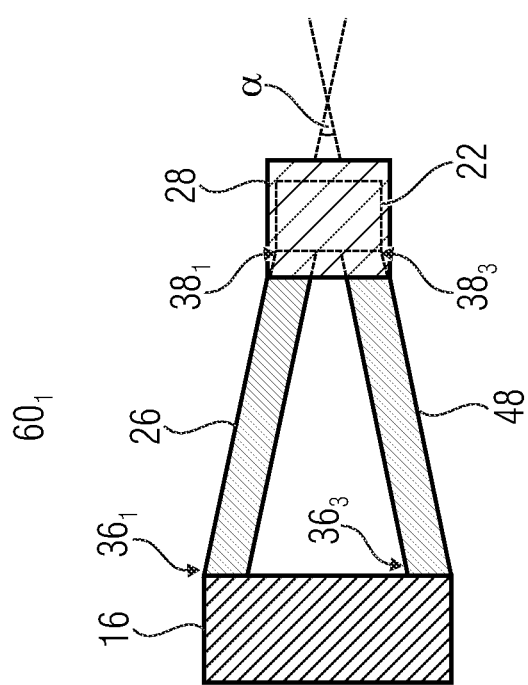
Fig. 6b
Fig. 6a

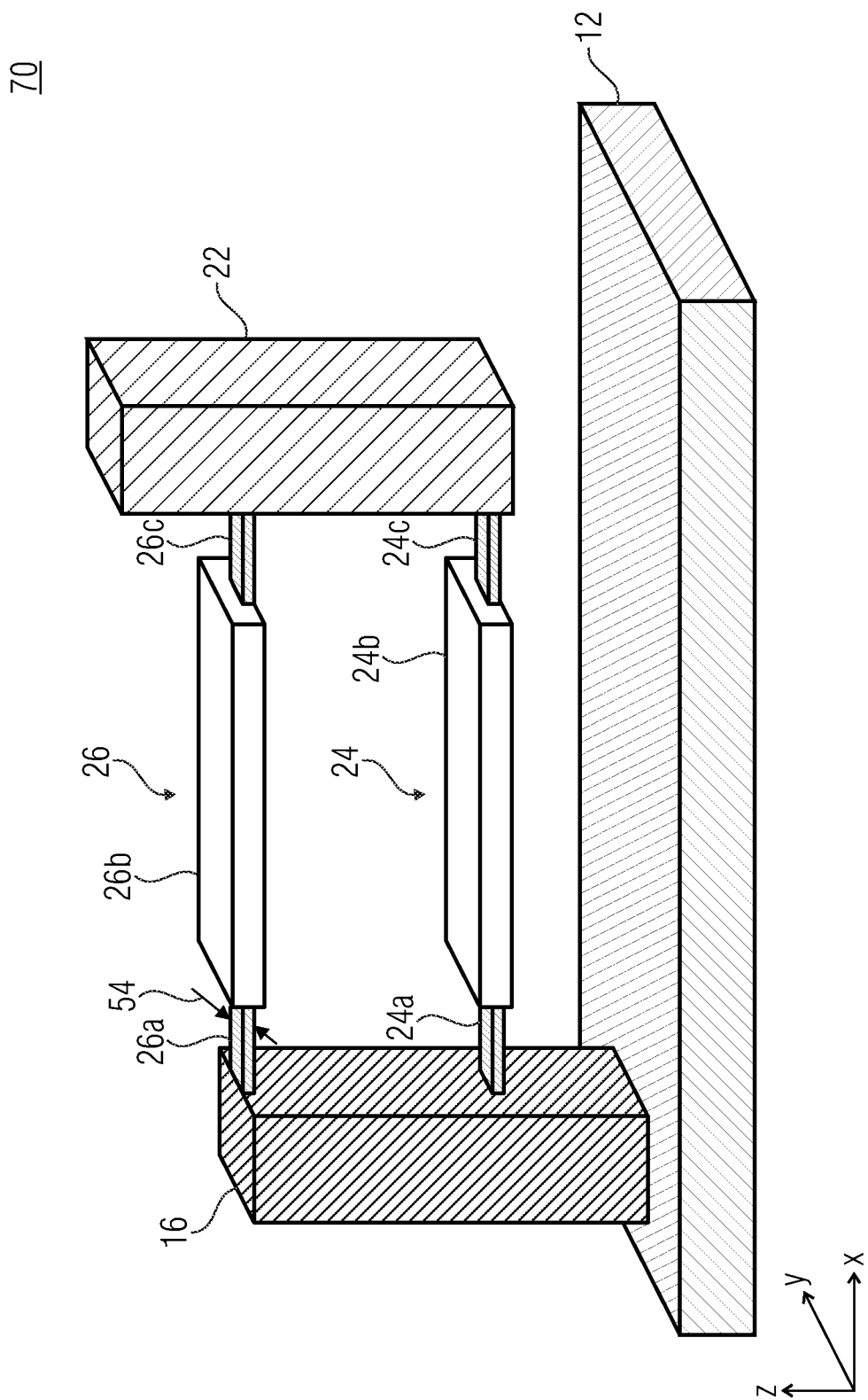

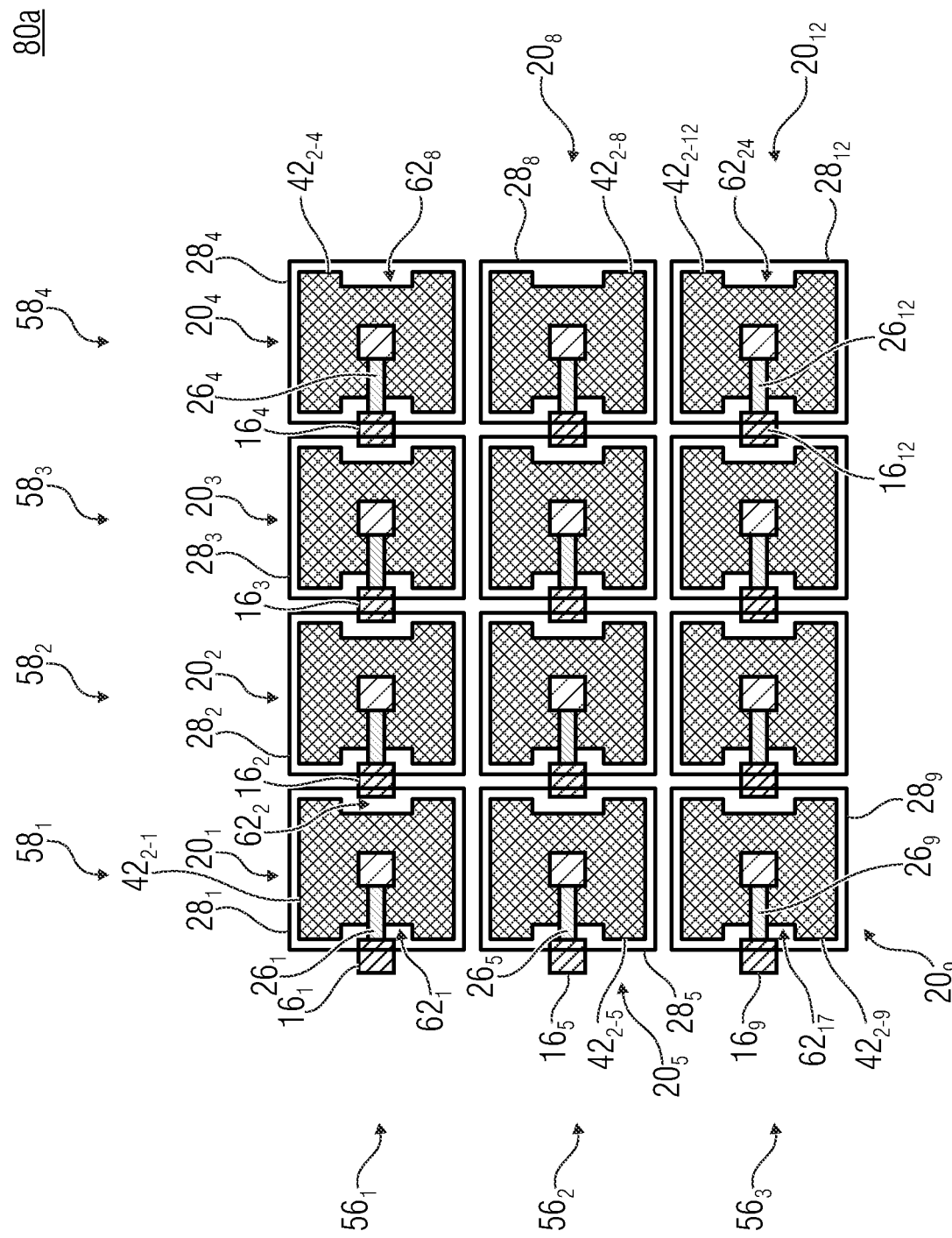

MEMS COMPRISING A MOVABLE STRUCTURAL ELEMENT, AND MEMS ARRAY

CROSS-REFERENCES TO RELATED APPLICATIONS

This application is a continuation of copending International Application No. PCT/EP2019/061969, filed May 9, 2019, which is incorporated herein by reference in its entirety, and additionally claims priority from German Application No. DE 102018207783.5, filed May 17, 2018, which is incorporated herein by reference in its entirety.

The present invention relates to a microelectromechanical system (MEMS), in particular to a MEMS comprising a movable structure deflectable on the basis of spring elements, and to an array of MEMS. The present invention further relates to a MEMS actuator comprising straight guidance by means of double springs.

The present invention further relates to the design of a MEMS actuator.

BACKGROUND OF THE INVENTION

MEMS actuators may be used for a wide range of applications, such as scanner mirrors, optical cross-connect switches, microvalves, electrical microswitches, and others. Particularly relevant here are light-panel modulators, wherein the actuators, mostly as a two-dimensional array, move and position micromirrors connected thereto as desired.

In most cases, the position of a movable actuator part is controlled by an applied electrical signal. In many cases, electrostatic attraction is used as a physical effect, but electromagnetic forces as well as piezoelectric or thermal expansion may also be used.

Due to the type of movement that may be performed, a distinction is made between rotary/tilting actuators and translatory actuators, as well as actuator types that allow both types of movement. In the latter case, the movement components may either be fixedly coupled by the type of suspension or may be individually controlled by several control signals (e.g. piston-tip-tilt). The type of movement as well as the deflection sought for are usually determined by physical parameters and boundary conditions of the application. These may be, for example, the wavelength of the light to be modulated or the angular range of a scanner.

Often large numbers of such actuators are arranged, densely packed on a carrier substrate, within one plane, and the desired deflection direction is perpendicular to this plane. The shape and size of the micromirrors is usually limited by the application and optical boundary conditions. Small mirrors allow a compact component and large diffraction angles and are therefore often advantageous. Their size also determines the available space for the design of the elastic suspension or the springs of the actuator. In addition to the springs, this limited space may also accommodate their fixations, the posts.

In the MEMS actuators for translatory movements that are known so far, the springs are usually manufactured within one technological level, i.e. etched out of a layer of a uniform material in one step. Their geometry has such a symmetry that no undesired tilting should occur upon deflection. In square or rectangular arrangements, four similar springs are usually found, sometimes only two; in hexagonal mirrors, one often uses three, sometimes six similar springs. These spring arrangements almost invariably have a correspondingly manifold rotational symmetry, often also one or more mirror symmetries. These entail at least two anchor points or posts, to which one end of at least one spring is connected.

In principle, several springs may be attached to one post, whereby these springs are then electrically connected. Since the springs also form the electrical supply line to the movable actuator part, all actuators will then have the same electrical potential, which is undesirable here, however. For electrically addressing the actuators individually, several posts per actuator would therefore be needed. The remaining space in combination with the minimal structural sizes and layer thicknesses that are still producible often allows using springs only, which are quite stiff as compared to the addressing forces that may be implemented.

If an actuator is suspended on several posts by means of springs, a production-related or thermal stress within the spring plane may significantly influence the spring constant. This effect is particularly strong if the springs are radially straight. In this case, the stress, once built in or thermally induced, may not relax. In addition, the spring force is strongly nonlinear since the distance between the post suspension and the actuator increases as the deflection increases, whereby the spring is expanded. This non-linearity may also be advantageous, see [1], but the simultaneous dependence on layer stress makes this spring geometry difficult to control.

Therefore, kinked or bent springs, or springs that tend to lie in an azimuthal direction, are usually used for translational mirrors of conventional technology, see for example [2]. Thus, the stress dependence of the spring constant as well as nonlinearity become smaller but do not disappear completely.

It is also possible that springs are expanded to a greater degree than the mirror suspended from them, see for example [3], which may result in that the deflection direction may be designed to be rather soft. However, if an array of such actuators is densely arranged, the area available per pixel is not affected by this. Such spring arrangements may ideally result in a translational movement, but in case of asymmetric loads from outside, e.g. asymmetries and errors due to manufacturing, an unwanted tilt will easily overlap with the intended translation since such spring arrangements are inevitably quite soft as far as tilts are concerned.

Good parallel guidance with low sensitivity to tilting is known from translational inertial sensors, as described in [4], for example. Here, however, the desired movement takes place within the production level, and the spring arrangement only prevents the movable part from twisting around the axis perpendicular to this production level, but does not prevent tilting around axes within this plane. Four springs are used for each degree of freedom of movement in order to better prevent unwanted twisting or tilting due to the symmetry thus achieved. In addition, all springs are manufactured within a single technological production level and/or with a single lithography step. This solution is not suitable for translational motion perpendicular to the substrate and cannot be compactly arranged for large arrays of very small elements.

Asymmetric spring arrangements are also known in conventional technology, e.g. from [5], but these are intended for tilting modes of movement and are not suitable for purely parallel translation. Concepts according to [6] describe an approach where translation typically overlaps with tilting.

Even solutions according to [7] do not provide optimal results. Depending on the specific application, such concepts may allow for unacceptable tilting in case of strong external tilting influences or relative positional errors between the springs and the drive element due to manufacturing tolerances. Furthermore, a common electrical potential of the micromirrors cannot be implemented in the event of individually different potentials of the actuators.

SUMMARY

According to an embodiment, a MEMS may have: a substrate extending within a substrate plane and having a substrate extension that rises above the substrate plane; a movable structural element; a first spring element mechanically connecting the movable structural element to the substrate extension; and a second spring element mechanically connecting the movable structural element to the substrate extension; the first spring element and the second spring element providing a parallelogram guide of the movable structural element in relation to the substrate extension; wherein the movable structural element is asymmetrically suspended on one side by means of the parallelogram guide; wherein the actuator has an electrostatic drive; wherein the electrostatic drive has at least one substrate electrode and a movable electrode mechanically connected to the movable structural element, wherein an electric voltage applied between the substrate electrode and the movable electrode causes the deflection of the movable structural element; and wherein the movable electrode is disposed between the first spring plane and the second spring plane; or wherein the movable electrode is disposed between the first spring plane and the substrate.

According to another embodiment, an array may have a multitude of MEMS, which MEMS may have: a substrate extending within a substrate plane and having a substrate extension that rises above the substrate plane; a movable structural element; a first spring element mechanically connecting the movable structural element to the substrate extension; and a second spring element mechanically connecting the movable structural element to the substrate extension; the first spring element and the second spring element providing a parallelogram guide of the movable structural element in relation to the substrate extension; wherein the movable structural element is asymmetrically suspended on one side by means of the parallelogram guide; wherein the actuator has an electrostatic drive; wherein the electrostatic drive has at least one substrate electrode and a movable electrode mechanically connected to the movable structural element, wherein an electric voltage applied between the substrate electrode and the movable electrode causes the deflection of the movable structural element; and wherein the movable electrode is disposed between the first spring plane and the second spring plane; or wherein the movable electrode is disposed between the first spring plane and the substrate.

According to another embodiment, an array may have a multitude of MEMS, wherein each MEMS may have: a substrate extending within a substrate plane and having a substrate extension that rises above the substrate plane; a movable structural element; a first spring element mechanically connecting the movable structural element to the substrate extension; a second spring element mechanically connecting the movable structural element to the substrate extension; the first spring element and the second spring element providing a parallelogram guide of the movable structural element in relation to the substrate extension and for a movement of the movable structural element along a displacement direction perpendicular to the substrate plane; wherein the multitude of MEMS are arranged in a plurality of array rows parallel to a row extension direction, wherein MEMS of directly adjacent rows are offset with respect to a column direction; wherein the first and second spring elements of the multitude of MEMS are arranged in parallel with the row extension direction; wherein functional elements connected to the movable structural elements of a respective MEMS are free of overlap with respect to the associated substrate extensions of the MEMS; and wherein the electrodes connected to the movable structural elements of the respective MEMS have a recess which is adapted to the substrate extension of a MEMS of the directly adjacent array row.

According to another embodiment, an array may have a multitude of MEMS, wherein each MEMS may have: a substrate extending within a substrate plane and having a substrate extension that rises above the substrate plane; a movable structural element; a first spring element mechanically connecting the movable structural element to the substrate extension; a second spring element mechanically connecting the movable structural element to the substrate extension; the first spring element and the second spring element providing a parallelogram guide of the movable structural element in relation to the substrate extension and for a movement of the movable structural element along a displacement direction perpendicular to the substrate plane; wherein the array is formed such that functional elements of the plurality of MEMS that are connected to the movable structural elements each form one pixel of a multitude of pixels, wherein pixels of the multitude of pixels are repeated with a pixel pitch, wherein a spring length along an axial extension direction of the first spring element and/or of the second spring element is larger than the pixel pitch.

By arranging two springs within different spring planes, tilting under external influences may be avoided to a large extent, so that precise and robust positioning of the movable structure is possible. By suspending both springs on one side, production-related stress may be relaxed, which also benefits precision.

According to one embodiment, a MEMS comprises a substrate extending within a substrate plane and having a substrate extension that rises above the substrate plane. The MEMS includes a movable structural element, a first spring element mechanically connecting the movable structural element to the substrate extension, and a second spring element mechanically connecting the movable structural element to the substrate extension, the first spring element and the second spring element providing a parallelogram guide of the movable structural element in relation to the substrate extension. The parallelogram guide allows precise and robust positioning of the movable structural element.

According to one embodiment, the first spring element in a force-free state is at least partially disposed within a first spring plane arranged in parallel with the substrate plane, and the second spring element in the force-free state is at least partially disposed within a second spring plane arranged in parallel with the substrate plane and spaced apart from the first spring plane by a plane spacing so as to provide the parallelogram guide.

According to one embodiment, the first spring element and the second spring element, upon deflection of the movable structural element along a displacement direction perpendicular to the substrate plane, provide a displacement of the movable structural element along a first direction and a second direction perpendicular to the displacement direction that is the same within a tolerance range of 5% relative to the plane spacing. This enables a small amount of tilting of the movable structural element.

According to one embodiment, the parallelogram guide is formed such that attachment regions of the first spring element at the substrate extension and at the movable structural element and attachment regions of the second spring element at the substrate extension and at the movable structural element form a parallelogram in a force-free state.

According to one embodiment, attachment regions of the first spring element at the substrate extension and the movable structural element and attachment regions of the second spring element at the substrate extension and the movable structural element are arranged within a common plane which is arranged, within a tolerance range of ±10°, perpendicular to the substrate plane.

According to one embodiment, the first spring element and the second spring element are congruent, within a tolerance range of ±10%, in a projection parallel to a direction of movement of the movable structural element. This enables the spring elements to be formed by an etching process while using the same etching mask, and the same shape simultaneously allows the spring elements to absorb the same or at least similar forces and thus enables high precision of the position adjustment.

According to one embodiment, the movable structural element is suspended by the first spring element and the second spring element such that the movable structural element may be deflected along the displacement direction in parallel with the substrate extension within the tolerance range of ±5° without tilting, which enables high precision of a function of the MEMS.

According to one embodiment, the MEMS comprises an actuator configured to cause a deflection of the first spring element and the second spring element, which enables precise positioning of the movable structural element.

According to one embodiment, the actuator includes an electrostatic drive. An electrostatic drive enables precise deflection of the functional element.

According to one embodiment, the electrostatic drive comprises at least one substrate electrode and a movable electrode mechanically connected to the movable structural element, wherein an electric voltage applied between the substrate electrode and the movable electrode causes the deflection of the movable structural element. This allows individual addressing of individual MEMS in a compound/array.

According to one embodiment, the movable electrode is disposed between the first spring plane and the second spring plane; or between the first spring plane and the substrate. This allows a space-saving arrangement of the actuator along the direction of movement, for example below or above a functional element.

According to one embodiment, the at least one substrate electrode is a first substrate electrode, the MEMS comprising a second substrate electrode, the movable electrode being disposed between the first substrate electrode and the second substrate electrode, wherein the first substrate electrode and the second substrate electrode may be individually controlled, in a manner that is specific for each electrode, by an electrical voltage relative to the movable electrode. This allows active deflection of the movable structural element along positive and negative directions of movement.

According to one embodiment, the actuator comprises at least one of a piezoelectric drive, an electrostatic comb drive, a magnetic actuator, and/or a thermal actuator. This allows the MEMS to be adapted to different application conditions.

According to one embodiment, the substrate extension is formed as a post structure having a cross section with an aspect ratio of two arbitrary lateral directions of expansion, the aspect ratio having a value of at least 0.1 and at most 10.

According to one embodiment, the movable structural element has a functional element which is movable relative to the substrate on the basis of movement of the movable structural element.

According to an embodiment, the first spring element and/or the second spring element are formed to be straight at least in sections. This allows a simple geometry of the spring elements.

According to one embodiment, the first spring element and/or the second spring element in a central region comprise(s) a stiffening with respect to outer regions or is formed as a solid state joint. This enables both high level of force absorption and a high level of stiffness of the spring elements in directions of movement perpendicular to the intended deflection direction.

According to one embodiment, the first spring element and/or the second spring element are formed to comprise a first spring segment and a second spring segment that are connected to a third spring segment, the third spring segment being mechanically connected to the movable structural member, the first spring segment and the second spring segment being mechanically connected to the substrate extension and to the third spring segment. This allows a spring element which is tilt-compensated in itself, which may further improve precision of the guide.

According to one embodiment, the MEMS further includes at least a third spring element disposed between the movable structural element and the substrate and within the first or second spring planes. This enables a particularly robust support of the movable structural element against forces parallel to the substrate plane.

According to one embodiment, the third spring element has an angle of more than 0° and at most 120° in relation to the first spring element when projected into the substrate plane. Such an inclined arrangement enables a high level of force absorption during rotation or lateral displacement of the movable structural element.

According to one embodiment, the third spring element is disposed within the first spring plane, the MEMS comprising a fourth spring element disposed within the second spring plane and connecting the movable structural element to the substrate. This enables the movable structural element to be guided with particularly high precision within two different planes and, thus, provides a particularly high degree of robustness against tilting.

According to one embodiment, the substrate extension is a first substrate extension, wherein the at least third spring element is arranged between the movable structural element and a second substrate extension connected to the substrate. This enables a particularly high level of robustness against tilting.

According to one embodiment, the movable structural element includes a functional element. The substrate extension is laterally offset from a centroid of a surface of a functional element parallel to the substrate. This allows a high deflection amplitude of the functional element.

According to one embodiment, the functional element includes a mirror. This enables utilization of the MEMS in optical applications.

According to one embodiment, the movable structural element is formed to be electrically insulating at least in regions so as to electrically insulate the first spring element and the second spring element from each other. This enables the supply of different electrical potentials to different regions of the movable structural element, which may be connected to electrodes, for example.

According to one embodiment, a respective stiffness of the first spring element and of the second spring element along a direction parallel to the substrate plane is greater than a stiffness along the displacement direction by a factor of at least 5. This allows a further increase in the freedom from tilting.

According to an embodiment, an array comprises a multitude of MEMS according to the embodiments described herein.

According to an embodiment, the plurality of MEMS are arranged in accordance with a polygonal pattern.

According to an embodiment, the multitude of MEMS are arranged in a plurality of parallel array rows, where MEMS of a first array row and of a directly adjacent second array row are arranged to be offset from each other. This allows arrangement of comparatively longer spring elements.

According to one embodiment, an electrode of a MEMS has a recess that is adapted to the substrate extension of a MEMS of an adjacent array row. This enables a further increased efficiency in utilizing the surface area of the drive.

According to one embodiment, the plurality of MEMS may be controlled individually or in groups with respect to deflection of the movable structural elements. This allows a wide range of applications of the array.

According to one embodiment, the multitude of MEMS are arranged in a plurality of array rows parallel to a row extension direction, with MEMS of directly adjacent rows offset from one another with respect to a column direction. The first and second spring elements of the multitude of MEMS are arranged in parallel with the row extension direction. Functional elements connected to the movable structural elements of a respective MEMS are free from overlap with respect to the associated substrate extensions of the MEMS. The electrodes connected to the movable structural elements of the respective MEMS have a recess that is adapted to the substrate extension of a MEMS of the directly adjacent array row. Such a uniform arrangement enables a very high efficiency in utilizing the surface area of the movable elements.

According to one embodiment, functional elements connected to the movable structural elements have an area density of at least 80% in the event of a projection being parallel to a direction of movement of the movable structural elements. The movable functional elements are arranged in a parquetted manner. This allows advantageous utilization of the array, especially in optical applications.

According to an embodiment, the functional elements of the plurality of MEMS each form one pixel of a multitude of pixels, and pixels of the multitude of pixels are repeated with a pixel pitch. A spring length along an axial extension direction of the first spring element and/or second spring element is larger than the pixel pitch. This enables spring elements with a high degree of flexibility along the intended deflection direction of the spring elements.

BRIEF DESCRIPTION OF THE DRAWINGS

Embodiments of the present invention will be detailed subsequently referring to the appended drawings, in which:

FIG. 5a shows a schematic top view of a part of a MEMS according to an embodiment, wherein the spring elements are formed in a spiral shape;

FIG. 5b shows a schematic top view of a part of a MEMS according to an embodiment, wherein the spring elements are formed, in sections, to be straight and meandering;

FIG. 5c shows a schematic top view of a part of a MEMS according to an embodiment, wherein a tilt-compensated spring element extends between the posts;

FIG. 6a shows a schematic top view of a MEMS according to an embodiment, wherein a first and third spring element are suspended, within a first spring plane, from a common substrate extension;

FIG. 6b shows a schematic top view of a MEMS according to an embodiment, wherein a first and third spring element are suspended, within a first spring plane, from two different substrate extensions;

FIG. 7 shows a schematic perspective view of a MEMS according to an embodiment, wherein the spring elements are formed as a solid state joint structure, or are reinforced at their centers;

FIG. 8a shows a schematic top view of a regular array according to an embodiment;

DETAILED DESCRIPTION OF THE INVENTION

Figure 1:
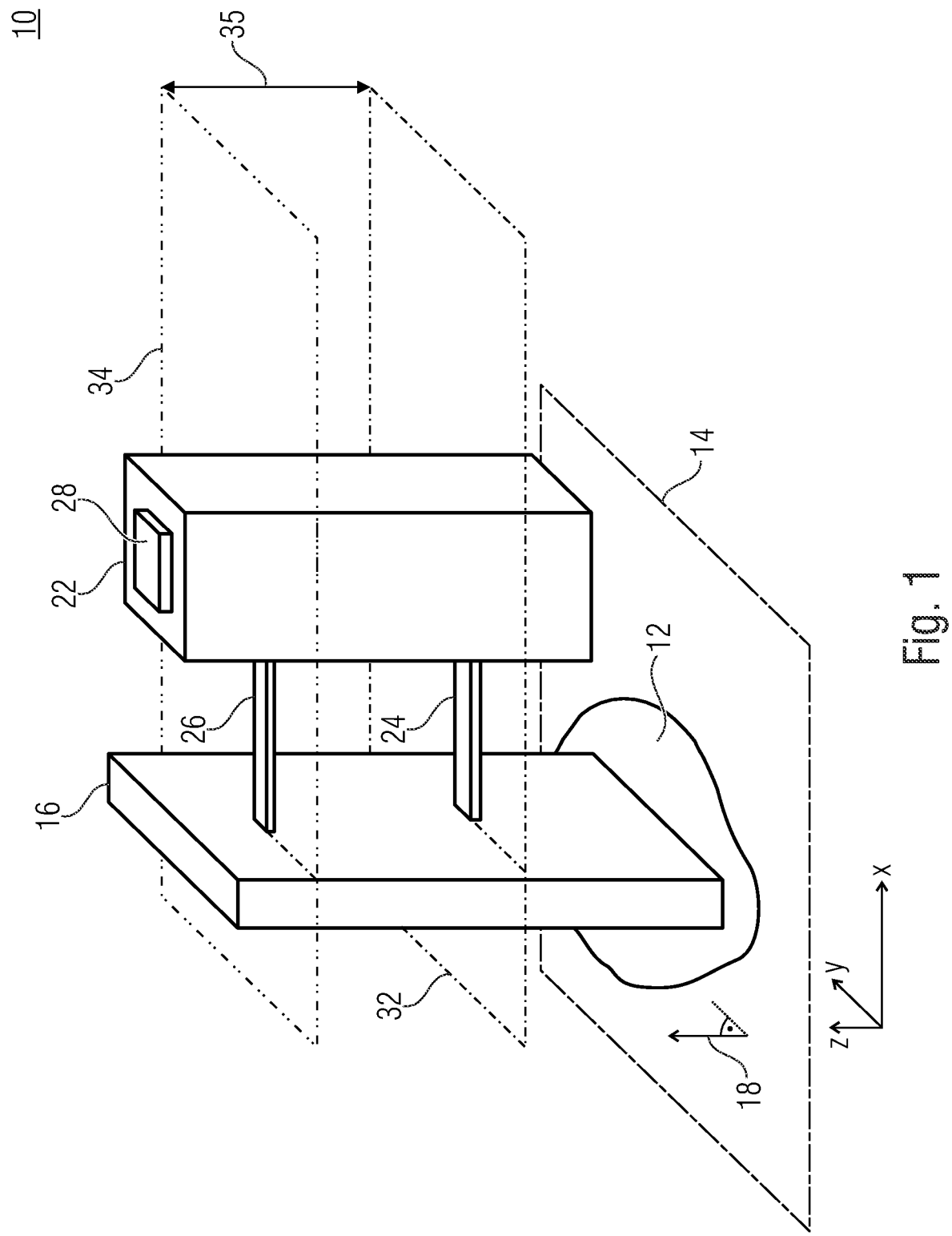
FIG. 1 shows a schematic perspective view of a MEMS according to an embodiment.

Before the following embodiments of the present invention will be explained in detail on the basis of the drawings, it shall be pointed out that elements, objects and/or structures in the different figures that are identical, identical in function or in action are provided with the same reference numerals, so that the descriptions of these elements that are provided in different embodiments are interchangeable or mutually applicable.

The following examples refer to microelectromechanical systems (MEMS) designed to deflect a movable structural element that may be connected to a functional element. Although the following embodiments refer to movable functional elements, which include a mirror, especially a micromirror, any other functional elements may be arranged, both in the optical field, e.g. lenses, filters or the like, and in other fields, e.g. for establishing an electrical contact or changing a mechanical distance.

MEMS may be manufactured in semiconductor technology; for this purpose, multi-layer arrangements are particularly suitable, including conducting, insulating and semiconducting layers, which may be separated by such layers or air gaps. MEMS may be obtained, for example, by a multi-layered sheet structure, which is reduced by selective removal of stack material, for example by an etching process, to expose MEMS structures. The substrate may be a silicon material, for example monocrystalline silicon, polycrystalline silicon or a doped silicon material. Conductivity may be generated in different layers, for example to provide the functionality of an electrode. Other layers may be metallized, for example, e.g. to provide a reflective surface and/or an electrically conductive surface.

FIG. 1 shows a schematic perspective view of a MEMS 10 according to an embodiment. The MEMS 10 comprises a substrate 12, for example a complete wafer or, alternatively, a partially or completely diced semiconductor wafer. The substrate 12 may form a surface parallel to a substrate plane 14 and may extend at least partially within the substrate plane 14. For example, the substrate plane 14 is arranged in parallel with a main side of a wafer, which may simply be referred to as top or bottom side without these terms having a restrictive effect since terms such as top, bottom, left, right, front, back and the like are variable or interchangeable on the basis of a change in orientation of the MEMS 10 in space.

A substrate extension 16 may provide an additional structure and may, e.g. in parallel with a surface normal 18 of a main side of the substrate 12, rise out of the substrate plane 14. This means that the substrate extension 16 has an extension perpendicular to the substrate surface 14, which may also be referred to as height. The substrate extension 16 may be a one-piece or multi-piece part of the substrate 12, may be formed from a layer stack, and/or may be a mechanically solid and, in simplified terms, an arranged element that is considered to be immovable. The substrate extension 16 will be referred to as a post in the following, although this does not imply any restrictions regarding the geometry of the substrate extension 16. A cross section of the post structure may, e.g., have an aspect ratio of any two lateral directions of expansion. The lateral directions may be parallel to directions x and y, which are, e.g., arranged in parallel with the substrate plane 14. Alternatively, the aspect ratio may also refer to expansions in directions which are arranged obliquely thereto and/or to one another. The aspect ratio, i.e. a value of an expansion along the first direction in relation to a value of the expansion along the second direction, may have a value of at least 0.1 and at most 10 according to an embodiment, but may also be different therefrom according to alternative embodiments.

The post 16 describes a part of the substrate 12 or an element which is mechanically fixedly connected to the substrate 12 and is considered to be immovable with respect to the substrate 12, even if high mechanical forces may lead to a slight deformation of the post 16. The post 16 may be formed from the same material as the substrate 12 or may be of a different material. For example, the post 16 may be formed, along its axial extension, to be electrically conductive or electrically insulating in different sections on the basis of different materials and/or dopants, which enables conduction of at least one electrical potential, but possibly also more than one electrical potentials, for example to different attachment regions.

The post 16 may rise in relation to the substrate plane 14 or may extend out of the substrate plane 14. For this purpose, the post 16 may be inclined or extend, in parallel with a surface normal 18 of the substrate 12, out of the substrate plane 14, and the surface normal 18 may be arranged perpendicularly on the substrate plane 14. Although the post 16 may have variable expansion along one or more directions perpendicular to the surface normal 18, the post 16 may still extend in parallel with the surface normal 18. Although other directions of orientation are also possible, aligning the post 16 in parallel with the surface normal 18 allows for a simple manufacturing process.

For better understanding of the embodiments described herein, the surface normal 18 may be understood to be parallel to a height direction which describes, for example, a z direction of a three-dimensional Cartesian coordinate system. Directions x and y may describe directions that are lateral thereto, wherein an x/y plane may be arranged in space to be parallel to the substrate plane 14.

The MEMS 10 comprises a movable structural element 22. According to one embodiment, the movable structural element 22 extends in parallel with the first post 16. According to alternative embodiments, the movable structural element 22 may also extend obliquely or perpendicularly thereto, the three-dimensional body still nevertheless having an expansion along the z direction. According to an embodiment, the movable structural element may be formed as a post structure or post. Although the following explanations refer to the design of the movable structural element 22 as a post, which is referred to as the second post in relation to the first post 16, a different geometry which extends in parallel with the surface normal and in parallel with the post 16 may be used or implemented. By extending along the height direction, the second post 22 may also be formed in one piece or in multiple pieces and may have a single layer, such as a metal, an alloy, silicon, silicon oxide, silicon nitride, alumina or the like, or a plurality of layers.

The second post 22 may have the same or different dimensions as the first post 16 along the x direction and/or along the y direction. The aspect ratio of the cross section of the second post 22 may be different from the aspect ratio of the first post 16, but may also be the same. The second post 22 may also be formed in one or more layers, and different layers may have different mechanical or electrical properties, for example with regard to electrical conductivity. Thus, different areas of the post 22 may have different conductivities and may possibly be insulated from one another. A layer of material may include a metal, an alloy, silicon, silicon oxide, silicon nitride, aluminum oxide or the like, and/or combinations thereof.

The post 22 is mechanically connected to the first post 16 by a first spring element 24. For example, the first spring element 24 is formed integrally with at least areas of the post 16 and 22 and/or is connected to the post 16 and/or the post 22 by other means, such as a bonding process or the like.

The MEMS 10 comprises a second spring element 26 arranged between the second post 22 and the first post.

The first spring element and the second spring element provide a parallelogram guide of the post 22 in relation to the post 16. For this purpose, the spring elements 24 and 26 provide a mutually parallel movement, at least within tolerances, if they are deflected by the influence of a force, e.g. by an actuator. The parallel movement may be based on a deflection and/or curvature of the spring elements 24 and 26, for example. The parallelogram guide may thus be maintained even in the absence of mechanical bearings in areas of the connections between the spring elements 24 and 26 and posts 16 and 22 by at least partially maintaining the movement or deflection by means of deformation of the spring elements 24 and 26. A parallelogram guide in connection with the embodiments described herein comprises two springs extending essentially in parallel with each other, i.e. springs which, within the manufacturing tolerances, have, for example, a same expansion along one direction between the posts 16 and 22.

According to an embodiment, the parallelogram guide may be implemented such that the spring element 24 is arranged, in its rest position or in a force-free state, within a first spring plane 32 which is spatially arranged in parallel with the substrate plane 14. The spring element 26 in its rest position or in a force-free state is also arranged in parallel with the substrate plane 14, but within a second spring plane 34 different from the spring plane 32. The spring planes 32 and 34 may have different distances to the substrate plane 14 and/or be arranged in parallel with each other with a plane spacing 35. Although the spring plane 32 is shown to have a smaller distance to the substrate 12 or to a bottom surface or to the substrate plane 14 than does the spring plane 36, both spring planes may easily be interchanged. According to further embodiments, the spring planes 32 and 34 may be inclined with respect to the substrate plane 14.

By suspending the post 22 via the spring elements 24 and 26, a movement of the post 22 may be obtained which is relative to the substrate 12, e.g. in parallel with the post 16 and/or in parallel with the surface normal 18. The movement is effected, for example, such that a deflection of the post 22 in parallel with the post 16 is effected. In this way, a structure similar to a parallelogram may be obtained since a deflection or movement of the second post 22 with respect to the first post 16 and in parallel with the surface normal 18 may be effected essentially while a parallelogram form of the two posts 16 and 22 and the two springs 24 and 26 is maintained. Asymmetrically suspending the post and/or suspending it on only one side may save installation space for further suspensions and still be precise due to the parallelogram guide.

One-sided suspension, or suspension on one side or on only one side of the post 22 may be understood to mean, within the context of the embodiments described herein, that the post 22 in a top view is located, completely or at least for the most part, i.e. more than 50%, more than 70% or more than 90% and including its center of gravity, outside the (foot) surface of the substrate extension, i.e. the post 16.

As illustrated in FIG. 1, the post 16 may be connected to the post 22 exclusively via the spring element 24 and the spring element 26, i.e. no further connecting elements are required.

The springs may have a curvature in the deflected state. Within the context of the embodiments described herein, the term parallelogram guide or parallelogram shape refers to a configuration according to which the (centers of gravity of the) four attachment regions of the springs at the posts still form a parallelogram.

If the spring elements 24 and 26 are deflected to deflect the post 22 along a positive or negative deflection direction or displacement direction z, the resulting curvature of the spring elements may cause the post 22 to be laterally displaced, e.g. along a negative x direction. The spring elements 24 and 26 are formed such that this displacement is the same within a tolerance range of 5%, advantageously 3% and especially advantageously 1% with respect to the plane spacing 35. This displacement is also advantageously the same within these tolerances along the direction y. The smaller a deviation of the lateral displacements, the smaller the tilt of the movable post 22 may be. However, the tilt may be kept sufficiently small for the post 22 to be deflected without tilting within a tolerance range of ±5°, advantageously ±2° and especially advantageously ±1°.

The MEMS 10 may include a functional element 28 which is connected to the post 22 or is part of it. For this purpose, the functional element 28 may be formed in one piece with the post 22 and/or be mechanically fixedly connected to the post 22. The functional element 28 may be an element whose position is adjusted, controlled or at least influenced by the MEMS 10. For example, the functional element 28 may be a micromirror or an electrically conductive structure.

The spring elements 24 and 26 may be formed such that a height or thickness parallel to the surface normal 18 is less than a spring length along an axial extension direction, e.g. along the x direction, and less than a spring width, e.g. in parallel with the y direction and/or perpendicular to the spring length, so that a spring stiffness along the spring width is comparatively high as compared to a spring stiffness parallel to the spring thickness. Hereby, the stiffness of the first spring element 24 and of the second spring element 26 along a direction, e.g. x and/or y, in parallel with the substrate plane may be greater by a factor of at least 5, at least 10 or at least 20 than a stiffness along the displacement direction z. By arranging the spring elements within different planes and between the first post 16 and the second post 22, a high stability perpendicular to the intended direction of movement z and/or toward tilting, in particular about the x and y axis, may thus be obtained. The direction of movement of the post 22 and/or of the functional element 28 that is caused by the deflection may be arranged in parallel with the thickness direction z of the MEMS.

FIG. 1 schematically shows a force-free state of the MEMS 10 in which the spring elements 24 and 26 extend in parallel with the substrate plane 14. However, under the influence of stress gradients in the springs or external forces, for example a weight force of the post 22 and/or of the functional element 28, a curvature of the spring elements 24 and/or 26 may occur, which, however, is unchanged in leading to the fact that the spring elements 24 and 26 are at least partially arranged within the associated spring plane 32 or 34, due to the fact that at least one area of the spring element 24 or 26 remains within the respective plane 32 or 34.

Figure 2:
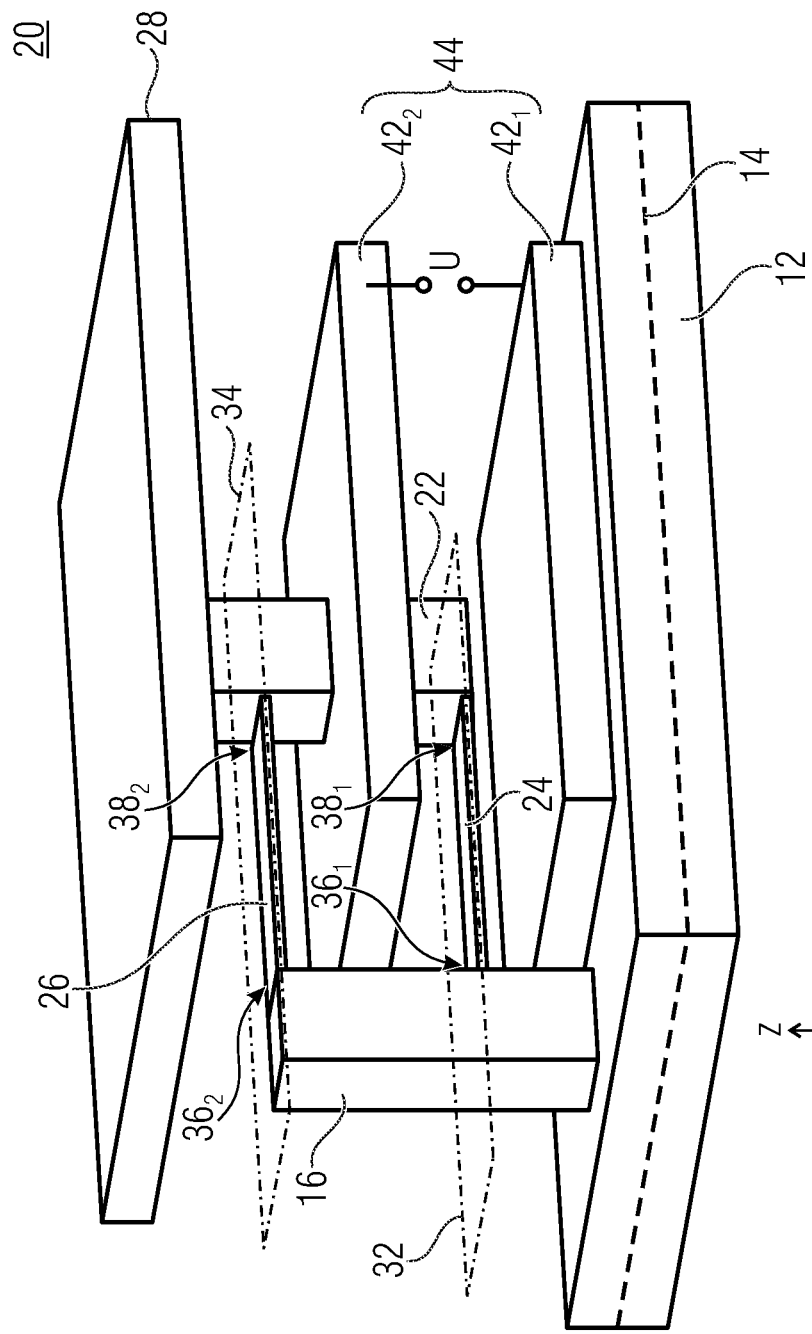
FIG. 2 shows a schematic perspective view of a MEMS according to an embodiment with two spring elements arranged between two posts.

FIG. 2 shows a schematic perspective view of a MEMS 20 according to an embodiment. The spring elements 24 and 26 are each arranged between the first post 16 and the second post 22, with the spring element 24 extending between an attachment region $36_1$ at the first post 16 and an attachment region $38_1$ at the second post 22. The spring element 26 extends between an attachment region $36_2$ at the first post 16 and an attachment region $38_2$ at the post 22. A distance between the attachment regions $36_1$ and $36_2$ at the first post 16 and a distance between the attachment regions $38_1$ and $38_2$ at the second post 22 may be equally large at least within a tolerance range of 10%, ±5% or ±2%, e.g. on the basis of arranging the spring elements 24 and 26 within the spring planes 32 and 34, respectively.

Although the spring elements 24 and 26 are congruent at least within a tolerance range of 10%, 5%, or 2% in the event of projection onto substrate plane 14, the embodiments described herein are not limited to this. Thus, even identical degrees of spring stiffness along the z direction with different geometries may lead to the same or a similar effect, and even geometries and/or degrees of spring stiffness which are already different allow a high degree of stability. For example, the spring elements 24 and 26 may be designed to be congruent, with slight differences in the expansions on the basis of scattering or slanted edges of the etching process.

According to one embodiment, the first post 16 is laterally offset from a centroid or geometric center of a surface of the functional element 28. For example, the second post may be arranged in a region of a centroid of a main surface at least along the projection direction along z. The actuation or deflection of the functional element 28 may thus be asymmetrically formed with respect to an arrangement of the components in parallel with the substrate plane 14.

The functional element 28 may overlap with respect to a projection of its surface into the substrate plane 14 within the x/y-plane, i.e., it may have a larger surface than the post 22. This allows a low mass of the complete system that is to be moved. Alternatively, the post 22 may have the same dimension or a larger dimension. The functional element 28 may comprise an optically effective element such as a mirror, or may be formed as a micromirror, so that a large surface extension is advantageous. The functional element 28 may have a partial or complete overlap with the springs 24 and 26 and may even protrude into an area of the post 16. Advantageously, the functional element 28 is formed to be axially symmetric, with respect to the post 22, along one or more mirror axes, and/or to be rotati-onally symmetric around a centroid of a surface of the post 22 parallel to the substrate plane 14. The springs 24 and/or 26 may be formed to be completely straight, for example as bending beams. Alternatively, it is also possible to form the springs 24 and/or 26 to be straight in several sections, in which case the sections are arranged at an angle to one another. Alternatively, it is also possible to form a curved spring 24 and/or 26 within the respective spring plane 32 or 34.

The MEMS 20 comprises a first electrode $42_1$ and a second electrode $42_2$, which together form an electrostatic drive or actuator 44 for deflecting the post 22 and, thus, the functional element 28. The electrode $42_2$ may also be referred to as an actuator plate. The electrode $42_1$ may be a flat electrode that is located between the substrate 12 and the functional element 28 and, for example, is mechanically fixedly connected to the substrate 12. The second electrode $42_2$ may be plate-shaped, i.e., form an actuator plate, and is, for example, mechanically fixedly connected to the post 22. Alternatively, at least one of the electrodes $42_1$ and/or $42_2$ may also have a shape different from a plate, so that each of the electrodes of the actuator may be formed to be flat or to be different therefrom.

Application of an electrical voltage U between the electrodes $42_1$ and $42_2$ may, for example, cause an attractive force between the two electrodes, which leads to a deflection of the springs 24 and 26, so that a distance between the functional element 28 and the substrate 12 is reduced.

The functional element 28 may overlap with the fixed posts 16. According to embodiments, the electrode $42_2$ may have a larger surface area than shown in FIG. 2 and, for example, be approximately as large as the functional element 28 or even larger. In one area of the post 16, the electrode $42_2$ may have a recess which allows a non-contact between the post 16 and the electrode $42_2$.

In other words, the desired pure translational movement along z may be enforced by producing at least two springs in different technological production levels/spring planes which have different distances to the substrate. Ideally, these two springs fix two different points of the actuator each in the two spatial dimensions parallel to the substrate (as well as with respect to rotation around the connecting axis of these points) and, thus, allow movement in the desired direction only. The production of two springs at two separate technological levels may be more complex and, thus, more expensive than an implementation with only one spring plane, which could be considered to be disadvantageous. This potential disadvantage will, however, be at least compensated for by the significantly improved parallel guidance of the actuator, so that the additional effort is more than justified. In addition, the two springs may easily be used to apply the two desired different electrical potentials to the actuator and the micromirror connected thereto since an insulating layer between the separate spring planes may be implemented in terms of production technology. As in [7], a fixed post, i.e. a post directly connected to the substrate, per actuator and the use of a correspondingly asymmetrical spring and/or actuator geometry may already yield very good results. Due to the suspension from only one fixed post, a layer tension in the spring, which may exist for production-related reasons, may relax, and the stiffening of the springs, which increases as deflection increases, may be avoided. At the same time, space for only one post needs to be provided, leaving more space for the actuator.

The two springs 24 and 26 together may have twice the spring stiffness as compared to a single spring, given the same height or thickness. In this respect, the spring elements 24 and 26 may have a small extension (height/thickness) along the z direction and be formed to be thin. For example, the spring elements 24 and/or 26 may have a thickness within a range of at least 10 nm and at most 1,000 nm, advantageously of at least 20 nm and at most 200 nm, and especially advantageously within a range of at least 20 nm and at most 60 nm. The spring stiffness for the relevant bending modes during operation of the MEMS may be proportional to the cube of the spring thickness, so that two springs or spring elements may still have about 79.4% of the thickness of a single spring for comparable stiffness. FIG. 2 shows an actuator comprising an inventive micromirror, wherein, for example, the drive is effected by an electrostatic field between the actuator plate (electrode $42_2$) and the address electrode (electrode $42_1$). Alternatively, the actuator plate might be located below these spring elements 24 and 26 rather than between them, i.e. the electrode $42_2$ may be located between the spring 24 and the electrode $42_1$. For simplicity's sake, FIG. 2 shows a square actuator plate $42_2$, which is connected in its center to the spring elements 24 and 26 via the movable post 22. For the embodiments to function, such an arrangement is possible, but not required. In order to obtain the mutually closest possible arrangement of several MEMS in one array, it may even be of greater advantage to choose a different arrangement since the post 16 in this case takes up more space than is absolutely needed. Instead, the actuator, for example, may be recessed such that it occupies, together with the post 16, an area that may be used to parquet the substrate plane.

Figure 3:
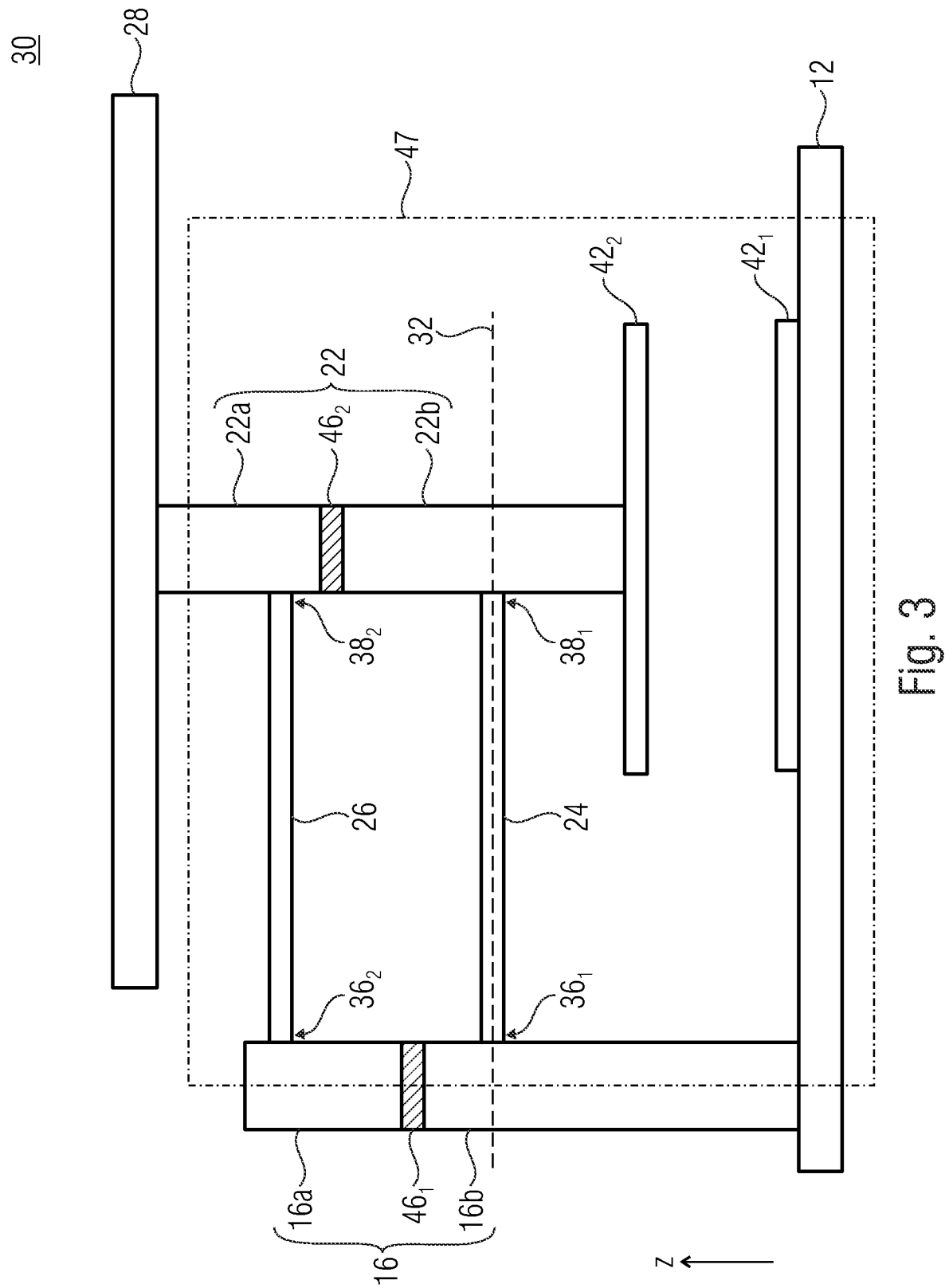
FIG. 3 shows a schematic sectional lateral view of a MEMS according to an embodiment, wherein an electrode is arranged between one spring element and another electrode along a z direction.

FIG. 3 shows a schematic sectional lateral view of a MEMS 30 according to an embodiment, wherein the second electrode $42_2$ is arranged, along the z direction, between the spring element 24 and/or spring plane 32 and the first electrode $42_1$.

Along its axial path parallel to the z direction, the post 16 may have an insulating region $46_1$ which may be obtained, for example, by means of an electrically insulating material in the layered structure of the MEMS 30. In the same or a different plane, the post 22 may have an insulating region $46_2$ along its axial path parallel to the z direction, which may be obtained, for example, by means of an electrically insulating material in the layered structure of the MEMS 30. The electrically insulating regions $46_1$ and $46_2$ may be arranged within a common plane, for example as part of a common layer in a semiconductor stack. By means of the insulating regions $46_1$ and $46_2$, subregions 16a and 16b of the post 16 and subregions 22a and 22b of the post 22 may be electrically insulated from one another, so that different electrical potentials may be led, via the spring elements 24 and 26, into the different subregions 22a and 22b via the post 16, so that a first potential may be applied to the electrode $42_2$ and a second electrical potential may be applied to the functional element 28. The electrically insulating region $46_1$ and/or $46_2$ may also be arranged within the MEMS 20, for example in an area of the post 22 that is located between the electrode $42_2$ and the spring element 26.

On the basis of the insulating region $46_2$ and of electrical insulation of the spring elements 24 and 26 in the post 16 by the region $46_1$, the spring element 24 may be electrically insulated from the spring element 26 due to the fact that the post 22 is designed to be electrically insulating in certain areas.

The parallelogram guide may be formed such that the attachment regions $36_1$, $36_2$, $38_1$ and $38_2$ of the spring elements 24 and 26 at the posts 16 and 22 form a parallelogram in the depicted force-free state, e.g. when the attachment regions $36_1$, $36_2$, $38_1$ and $38_2$ are projected into a plane 47 which is arranged, within a tolerance range of ±10°, advantageously ±5° and particularly advantageously ±1°, or advantageously ±0°, in parallel with the displacement direction z and in parallel with a main extension of the spring elements 22 and 24 along a shortest connection between the posts 16 and 22. Due to the parallelogram guide, the structure of a parallelogram may be maintained even if the spring elements are deformed.

In other words, for different electrical potentials at the actuator plate and the micromirror, the post 22 may be configured to be partially insulated.

Figure 4:
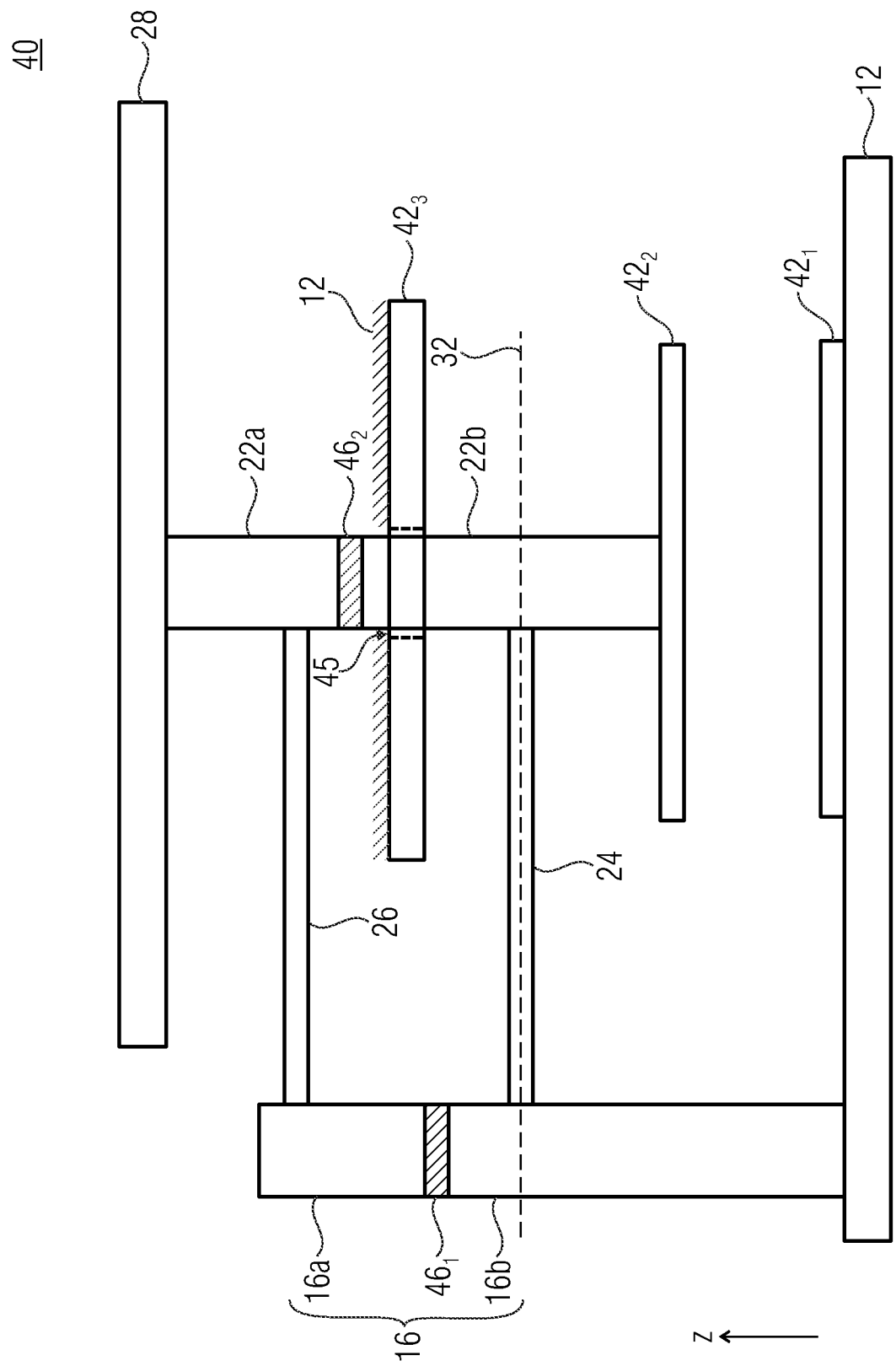
FIG. 4 shows a schematic sectional lateral view of a MEMS according to an embodiment, wherein a second substrate electrode is arranged in addition to a substrate electrode of FIG. 3.

FIG. 4 shows a schematic sectional lateral view of a MEMS 40 according to an embodiment, wherein a second substrate electrode $42_3$ is arranged in addition to the substrate electrode $42_1$. The electrode $42_2$ is arranged between the substrate electrodes $42_1$ and $42_3$, and different electrical voltages or potentials may be applicable to the substrate electrodes $42_1$ and $42_3$ in relation to the electrode $42_2$ in a manner that is specific to each electrode, so that, for example, both an active deflection in the negative z direction, e.g., by applying an electrical voltage between the electrodes $42_1$ and $42_2$, and an active deflection along the positive z direction, e.g., by applying an electrical voltage between the electrodes $42_2$ and $42_3$, are possible. The electrode $44_3$ may be mechanically connected to the substrate 12 or to an immovable structure.

The deflection refers to a change in the position of the functional element 28 along the positive or negative z direction. For example, the subregion 16 of the post 16 may, via an electrically conductive connection, have a different electrical potential applied to it than the subregion 16b. In an array according to an embodiment which comprises a multitude of MEMS, for example, the respective subregions 16a may be electrically connected to one another, for example via conductive structural elements.

The electrode $44_3$ may be formed to enclose the post 22, for example by having a recess 45. The post 22 may pass through the electrode $44_3$ without contact or at least with low friction.

As an alternative or in addition to the electrostatic drive 44, a MEMS according to the embodiments described herein may have a piezoelectric drive configured to cause a deflection of the post 22 parallel to the post 16. For example, a piezoelectric area actuator may be located at or inside the spring element 24 and/or 26. Alternatively or additionally, an electrostatic comb drive, a magnetic actuator and/or a thermal actuator may be arranged to deflect the functional element 28.

FIG. 5a shows a schematic top view of parts of a MEMS $50_1$ according to an embodiment, wherein the spring elements 24 and 26 may be congruent at least within a tolerance range of 10%, 5% or 2% in a projection onto the substrate plane. For example, the spring elements 24 and 26 may be configured to be congruent, may have slight differences in terms of expansion on the basis of scattering or slanted edges of the etching process. The spring element 26 is formed to be straight in sections and forms, for example, a winding or spiral arrangement around the post 22 and/or the functional element 28. This enables large spring deflection and, thus, a high deflection amplitude of the functional element 28. Furthermore, low spring stiffness along the z direction (direction of movement) may be obtained.

FIG. 5b shows a schematic top view of parts of a MEMS $50_2$ according to an embodiment, wherein the spring element 26 is also formed to be straight in sections, in which case a meandering form of the spring element 26 is implemented. As described in connection with the MEMS $50_1$, the spring element 24 may be congruent in a projection into the substrate plane.

FIG. 5c shows a schematic top view of part of a MEMS $50_3$ according to an embodiment, wherein a tilt-compensated spring element comprising spring segments 26-1, 26-2 and 26-3 extends between the post 16 and the post 22. The spring segments 26-1 and 26-2 may be mechanically connected in parallel with each other and lead into the spring segment 26-3, which is mechanically coupled to the post 22. The spring segments 26-1 and 26-2 may be mechanically connected to the post 16 at the first ends with different, possibly opposite attachment regions $36_1$ and $36_2$, and may be mechanically connected to the spring segment 26-3 at the oppositely located other ends, which spring segment 26-3 fully or partly completes the mechanical connection between the posts 16 and 22 via its mechanical connection to the post 22. The spring segments 26-1 and 26-2 may thus be connected to a region of the post 22 via the spring segment 26-3. Optionally, the spring element(s) may be formed to be congruent within the spring plane 32.

Arranging of the spring segments 26-1 and 26-2 at the post 16 at opposite attachment regions $36_1$ and $36_2$ allows a symmetrical arrangement of the spring segments 26-1 and 26-2, in which case the attachment regions $36_1$ and $36_2$ may also be arranged on adjacent sides of the post 16 or on the same side of the post 16.

The illustrations of the MEMS $50_1$, $50_2$ and $50_3$ are limited to the spring plane 34 due to the view being a top view. The spring element(s) within the spring plane 32 may be formed to be congruent but may also be formed to be different.

In other words, FIGS. 5a to 5c show some examples of spring geometries that are longer and softer as compared to the straight connection according to FIGS. 2, 3 and/or 4, thus allowing larger deflections with the available actuator force. Other shapes are also possible, including those with curves instead of corners.

Real springs may also exhibit unavoidable yielding in a direction transverse to the desired deflection direction, which may eventually lead to slight tilting and, thus, local deflection errors under external influences. Although these influences may be acceptable, these deflections for springs that are formed to be straight may easily be kept smaller, by orders of magnitude, than the desired deflections, especially if the thickness (the dimension along z) is much smaller than a spring width, in which case a spring width 54 may be understood to be a lateral extension perpendicular to an axial curve of the spring element and perpendicular to the dimension along the z direction. Advantageously, the spring element has a thickness which corresponds to a maximum of 50%, 30% or 10% of the width 54.

FIG. 6a shows a schematic top view of a MEMS $60_1$ according to an embodiment, wherein the spring elements within the first spring plane and within the second spring plane are also formed congruently. A third spring element 48 is arranged within the same spring plane as the spring element 26, the spring element 26 extending between the attachment region $36_1$ at the post 16 and an attachment region $38_1$ at the post 22. The spring element 48 extends from an attachment region $36_3$, which is different from the attachment region $36_1$, to an attachment region $38_3$ at the post 22. The attachment regions $38_1$ and $38_3$ may be spaced apart, but may also form a common region. Even though the attachment regions $38_1$ and $38_3$ are shown to be located on a same side of the post 22, for example if said post 22 has a cross section of the type of a polygonal chain, the attachment regions $38_1$ and $38_3$ may also be located on different sides, for example adjacent sides. Each of the attachment regions $38_1$ and $38_3$ may extend across one side or several sides of the post 22, for example by in that the spring element 26 or 48 extends across a corner or edge of the polygon chain of the post 22.

A high quality of guidance may be obtained, for example, in that axial curves of, for example, straight springs 26 and 48 and/or axial curves between the attachment regions $36_1$ and $38_1$ or $36_3$ and $38_3$ have an angle α, which advantageously has a value of more than 0° and less than 120°. Values of at least 5° and at most 60° or of at least 10° and at most 45°, for example 30°, for the angle α are advantageous. This enables a high degree of force absorption with a design that is still compact.

Although only the spring element 48 is shown in one of the spring planes, the MEMS $60_1$ may also have a fourth spring element, which is located within the other spring plane, e.g. the spring plane 32, and which directly or indirectly connects the post 22 to the substrate.

FIG. 6b shows a schematic top view of a MEMS $60_2$ in which spring elements within the spring plane 32 may also be arranged to be congruent with the spring elements 26 and 48 shown. Alternatively, different spring geometries and/or different attachment concepts within different spring planes may be combined.

The MEMS $60_2$ features a further post $16_2$, which is firmly connected to the substrate and may also be referred to as a second substrate extension. The spring element 26 extends between the attachment region $36_1$ at the post $16_1$ and the attachment region $38_1$ at the post 22. The spring element 48 extends between the attachment region $36_3$ at the post $16_2$ and the attachment region $38_3$ at the post 22. The attachment regions $38_1$ and $38_3$ are located on two separate but adjacent sides of the post 22. The orientation of the spring elements 26 and 48 is, for example, 90°, although other angles of less than 90° or more than 90°, for example 60° or less, or 120° or more, may also be implemented. The angle advantageously has a value within a range of at least 60° and at most 120°. The MEMS $60_2$ may have a fourth spring element which is congruent, at least within tolerances, with the spring element 48, for example.

As shown in FIG. 1 to FIG. 4 as well as FIGS. 5a-c and FIG. 6a, a centroid of a cross section of the movable post 22, which cross section is obtained by a cut within the x/y plane, i.e. in a plan view, may advantageously be arranged outside a foot surface of the post 16. Alternatively or additionally, the MEMS may have at least a second post $16_2$ in addition to the post $16_1$, where the movable post 22 also being asymmetrically suspended on one side via the posts $16_1$ and $16_2$, and a centroid of the post 22 in a top view being arranged outside a foot surface spanned by the post $16_1$ and the post $16_2$. This is shown in FIG. 6b, for example, where the one-sided asymmetrical suspension is obtained in the diagonal direction of the post 22, the opposite diagonal side to the spring elements 26 and 48 is free from suspensions, for example. The foot surface of the post 16 that is mentioned in connection with FIG. 1 may be understood, in FIG. 6b and other embodiments, to be more than one post 16 as a surface spanned by the individual foot surfaces of the posts $16_1$ and $16_2$, which may apply to the individual surfaces as well as to a continuous minimum surface which is spanned by the individual surfaces, so that here, too, the centroid of the post 22 may also be arranged outside the surface spanned by the several (foot) surfaces.

According to an embodiment, the post 22 is suspended exclusively across the post 16. The post 22 may have a functional element 28 and/or be connected to it. The post 16 may be arranged to be laterally offset from a centroid of a surface of the functional element 28 parallel to the substrate 12, which together with the suspension on one side only (e.g. straight or diagonal) may cause an asymmetrical suspension.

In other words, FIGS. 6a and 6b show possibilities for a further improved guidance based on adapted spring geometries. Here, the straight spring pieces in different orientations exhibit a large amount of resistance to all kinds of external force directions within the spring plane and, thus, effectively prevent tilting in any direction. This may be implemented with only one fixed post as shown in FIG. 6a, but also in the variant with two fixed posts as shown in FIG. 6b. Further fixed posts and/or additional spring elements may also be arranged. By arranging two or more posts, any possible production-related stress within the spring plane may be largely relaxed, and stiffening of the spring arrangement in case of large deflections may be avoided. FIGS. 6a and 6b show other spring geometries in the top view with further improved stiffness against bending within the spring plane, FIG. 6a showing a spring geometry which is attached to a fixed post, and FIG. 6b showing a spring geometry which is arranged at two separate fixed posts.

A simple implementation is obtained if the spring elements within the two spring planes are congruent. However, it is also possible to use different spring shapes if they are optimized in relation to one another. In this respect, a spring system is considered to be optimized if the lateral displacements (in x and y) of the attachment regions of the springs at the post 22 are the same within both spring planes when the post 22 is deflected in the desired z direction.

FIG. 7 shows a schematic perspective view of a MEMS 70 according to an embodiment, wherein the spring element 24 and the spring element 26 are reinforced, at their centers, such that the deformation occurs essentially in the thin sections. Alternatively, these spring elements may also be formed as a solid state joint structure. Alternatively, it is also possible for only one of the spring elements 24 or 26 to be designed in this way or, as described in connection with other embodiments, for a solid state joint structure to be dispensed with.

The spring elements 24 and/or 26 may be implemented completely or partially as solid state joint structures in that, for example, edge regions 26a and 26c of the spring element 26 and/or edge regions 24a and 24c of the spring element 24 are is designed to be soft, i.e., to have a lower stiffness, as compared to a central region 26b or 24b, which is located between the outer regions 26a and 26c, and 24a and 24c, respectively. This may be achieved by a comparatively small thickness of, for example, not more than 50%, not more than 30% or not more than 20% along the z direction, and/or by a small spring width of not more than 80%, not more than 60% or not more than 40% as compared to the central region 24b and/or 26b. Solid state joints may be obtained on the basis of, for example, local thinning of the material in one or more directions. Alternatively, they may also be formed in separate production steps, possibly from a different material. This allows a high stiffness in directions transverse to the deflection direction z. In terms of complementary definition, the central region $24b$ and/or $26b$ may have a stiffening as compared to the outer regions $24a$ and $24c$, an $26a$ and $26c$, respectively.

In other words, another variation of the spring elements is when they are stiffened in their central region $24b$ and/or $26b$ by a reinforcement, so that essentially solid state joints are created at the fixed and movable posts 16 and 22 with an almost rigid connection between them. This variant is even more rigid with respect to any undesired force influences, especially in the highly deflected state. FIG. 7 shows the connection of the fixed post 16 to the movable post 22 by means of rigid elements in the central regions $24b$ and $26b$ and two solid-state joints or spring elements each in the edge regions $26a$ and $26b$, and $24a$ and $24b$, respectively. The actuator and the movable element are not shown for reasons of clarity.

As already mentioned, an electrostatic drive with an address electrode arranged in parallel with the actuator may be used to drive the MEMS, either individually or in combination with other drive principles. A particularly suitable other electrostatic drive principle is, for example, the double-action parallel plate actuator, which is described in connection with the MEMS 40 and in which the movable actuator plate is opposed by an immovable electrode plate not only below but also above. Another particularly suitable solution is a comb drive in which lamellae or fingers at the movable actuator or post 22 are electrostatically pulled between immovable lamellae or fingers. Other drive principles are also possible, in particular electromagnetic, piezoelectric and/or thermal ones.

FIG. 8a shows a schematic view of an array $80a$ according to an embodiment, which is arranged, e.g., as a regular array, wherein array rows $56_1$ to $56_3$ and array columns $58_1$ to $58_4$ are arranged in parallel with one another and without offset. The array $80a$ is shown in a top view, for example, in which the functional elements $28_1$ to $28_{12}$ are shown to be transparent in order to allow a representation of underlying elements. Alternatively, the illustration may also be understood as being "from below" or from one side of the substrate not shown. The array $80a$ comprises, e.g., MEMS $20_1$ to $20_{12}$. The number of array rows 56 and array columns is exemplary and may have, independently of one another, a value of at least 1, at least 2, at least 3 or a higher value, i.e. the array $80a$ may be formed, according to an embodiment, as a single row or a single column.

As shown in FIG. 8a, the functional elements $28_1$ to $29_{12}$ may overlap with the respectively associated posts $16_1$ to $16_{12}$ and/or with an adjacent post. For example, the functional elements $28_1$ and $28_2$ overlap with the post $16_2$. An overlap means a correspondence of a projection of the functional element with a projection of the post, each within the substrate plane and along a surface normal of the substrate plane.

In order to enable the electrodes $42_{2\text{-}1}$ to $42_{2\text{-}12}$ to be free of contact with the posts $16_1$ to $16_{12}$ while maintaining a high packing density of the MEMS $20_1$ to $20_{12}$, the electrodes $42_{2\text{-}1}$ to $42_{2\text{-}12}$ may have recesses $62_1$ to $62_{24}$. The recesses $62_1$ to $62_{24}$ may be adapted to the post $16_i$ of a MEMS of an adjacent array row in order to maintain a sufficiently large distance even in the event of a lateral movement of the electrodes. The recesses $62_1$ to $62_{24}$ may advantageously be arranged in areas of the electrodes $42_{2\text{-}1}$ to $42_{2\text{-}12}$ that are adjacent to one of the posts $16_1$ to $16_{12}$. The recesses $62_1$ to $62_{24}$ may be designed such that a minimum distance between the electrode $42_2$ and the post 16 is maintained both in the force-free state with respect to a post 16 of an adjacent MEMS and in the state of maximum deflection, which may cause the respective electrode $42_2$ to approach its own post 16.

As shown in FIG. 8a, an alignment of the spring elements $26_1$ to $26_{12}$ of the respective MEMS $20_1$ to $20_{12}$ with respect to the functional elements may be arranged along a row extension direction of the array rows $56_1$ to $56_3$. Alternatively, at least one of the MEMS may be formed such that the spring element 26 is arranged in parallel with a column extension direction of one of the columns $58_1$ to $58_4$. According to an embodiment, at least one spring element 26 has an orientation toward the column extension directions and row extension directions that is different from 0°, from 90°, from 180° and from 270°.

Figure 8B:
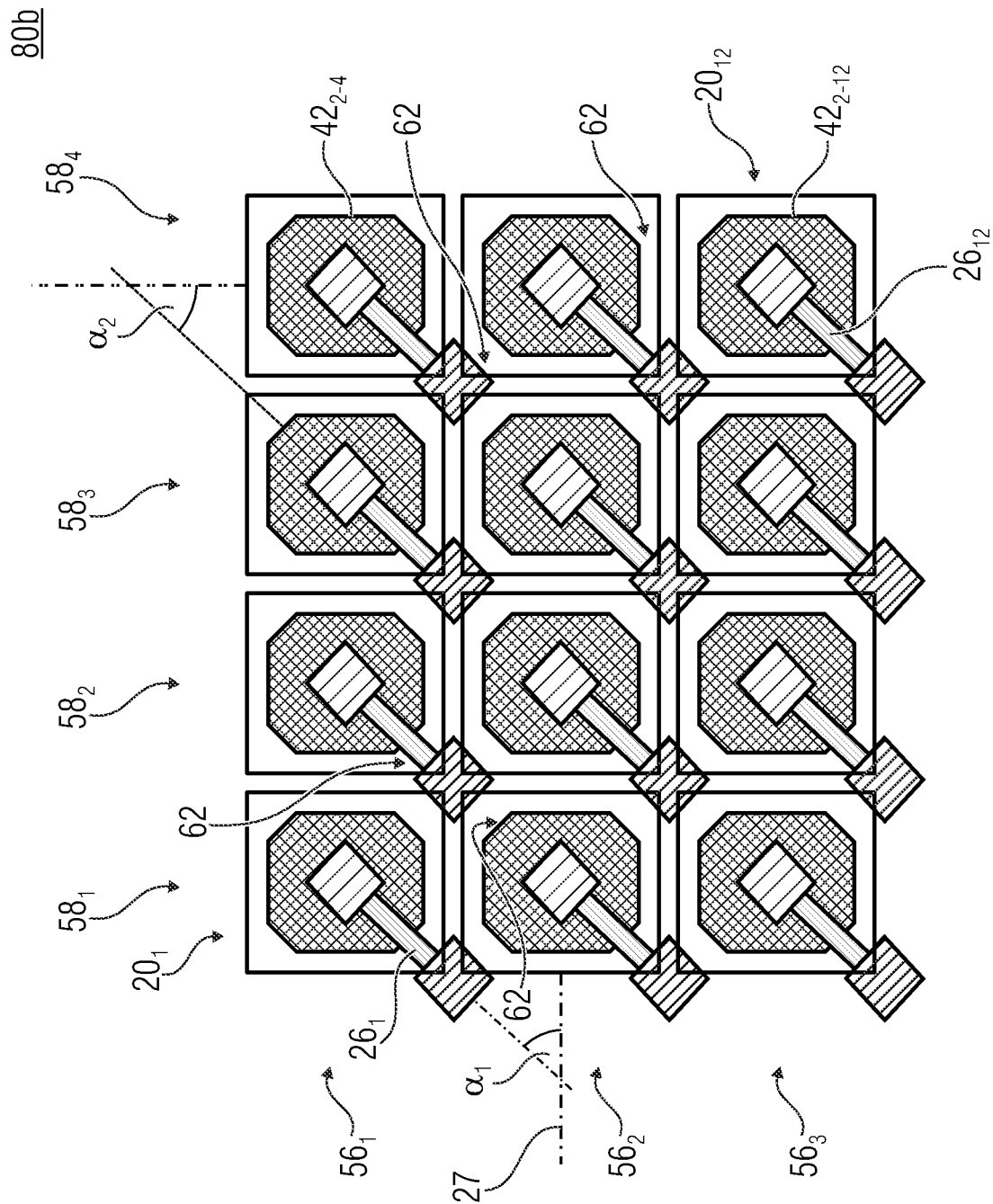
FIG. 8b shows a schematic top view of an array according to an embodiment, wherein spring elements are arranged obliquely to a row extension direction of the array.

FIG. 8b shows a schematic representation of an array $80b$ according to an embodiment which essentially matches the array $80a$. In contrast to the array $80a$, at least one of the spring elements $26_1$ to $26_{12}$ and possibly also at least one of the spring elements 24 has an angle $\alpha_1$ with respect to a row extension direction 67, along or parallel to which at least one of the array rows $56_1$ to $56_3$ is arranged. Furthermore, at least one of the spring elements $26_1$ to $26_{12}$ and optionally also at least one of the spring elements 24 has an angle $\alpha_2$ with respect to a column extension direction 69, along or parallel to which at least one of the array columns $58_1$ to $58_4$ is arranged. The angles $\alpha_1$ and $\alpha_2$ may each have an angle of more than 0° and less than 90°.

The recesses 62 of the electrodes $42_2$ may be arranged in areas adjacent to adjacent posts, e.g. in corner areas of the electrodes 42. The recesses 62 may be referred to as cut-off corners of the electrodes $42_2$. The recesses allow the provision of space or room for the fixed posts 16.

Figure 8C:
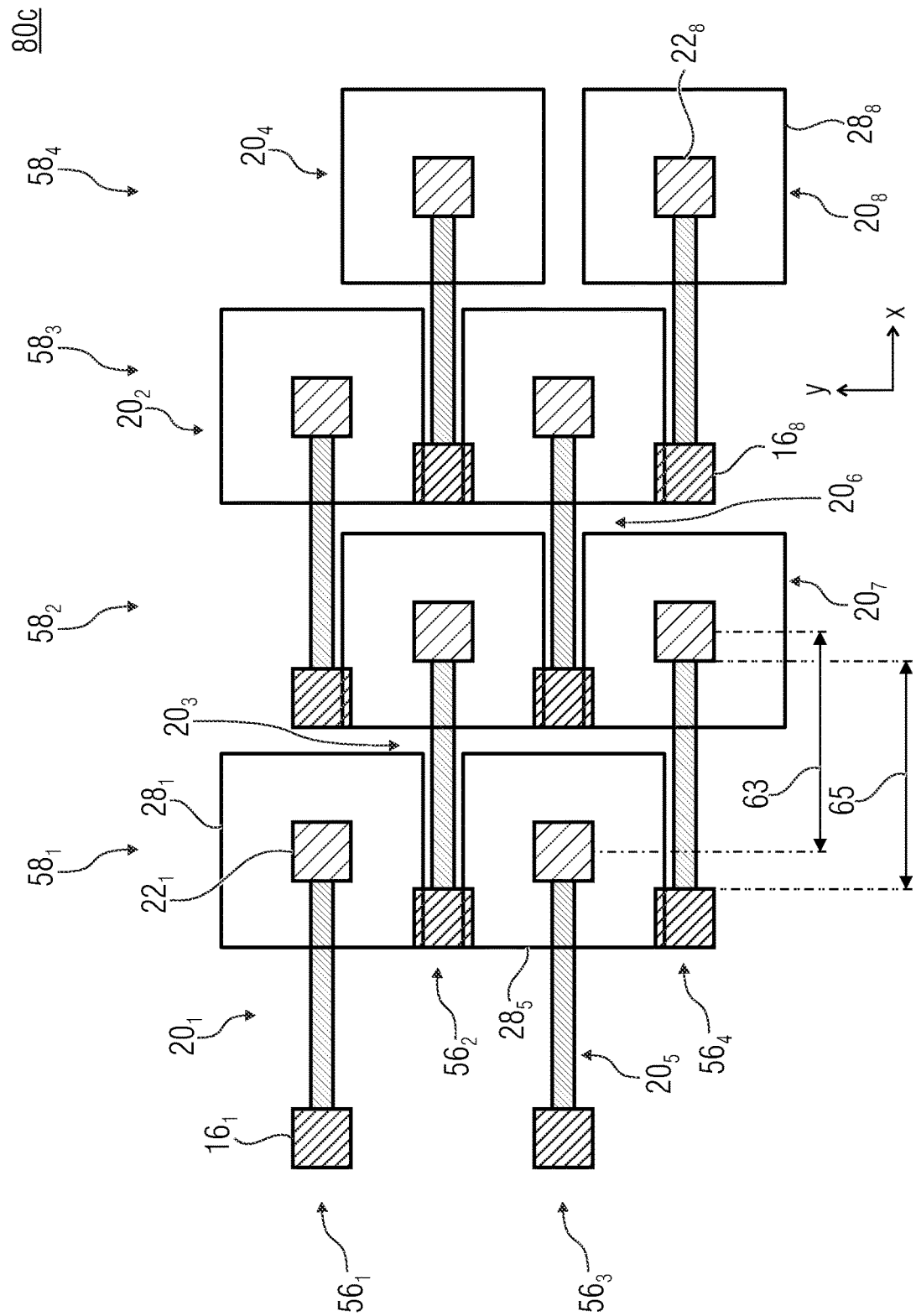
FIG. 8c shows a schematic top view of an array according to an embodiment, wherein array rows are arranged to be offset from one another.

FIG. 8c shows a schematic view of an array $80c$ comprising a multitude of MEMS according to embodiments described herein, with the array $80c$ comprising, for example, a multitude of MEMS $20_1$ to $20_8$. As compared to the array $80a$, the multitude of MEMS may be formed to be identical with or different from one another and, for example, may be regularly or irregularly arranged in a multitude of array rows $56_1$ to $56_4$ and/or in a multitude of array columns $58_1$ to $58_4$.

Directly adjacent array rows $56_1$ and $56_2$, $56_2$ and/or $56_3$ and/or $56_3$ and $56_4$ and/or directly adjacent array columns $58_1$ and $58_2$, $58_2$ and $58_3$ and/or $58_3$ and $58_4$ may be arranged to be offset from one another along the row extension direction x or column extension direction y, for example by exactly half an extension of the respective MEMS actuator along this direction. According to alternative configurations, the array rows 56 and/or array columns 58 may not be offset from each other, as shown in FIG. 8a, for example. As an alternative or in addition to the description given in connection with FIG. 8a, at least one, some or all of the functional elements 28 may have a recess that is adapted to the fixed posts of the MEMS of adjacent rows and/or columns. This allows a movement of the functional element 28 past the adjacent fixed post and, thus, a large movement stroke or amplitude. If even small movement amplitudes are sufficient, the functional element 28 may also project beyond adjacent fixed posts without coming into contact with them in case of deflection. MEMS $20_1$ to $20_8$ of the array 80 may be controlled in a manner that is individual in terms of MEMS, i.e., individually, in groups or globally in terms of MEMS with respect to a deflection of the functional elements $28_1$ to $28_8$. This is made possible by a control electrode of electrostatic drives or by other control means that may possibly be controlled in a manner that is individual in terms of MEMS, or may possibly be controlled at least group by group.

The MEMS $20_1$ to $20_8$ may be arranged in the array in accordance with to a polygonal pattern, such as a honeycomb pattern. For example, the movable elements may have an area density of at least 60%, at least 70% or at least 80% in case of projection parallel to a direction of movement of the second posts. Higher surface densities of more than 80%, about 85%, at least 90% or more are advantageous.

As shown in FIG. 8c, the functional elements $28_1$ to $28_8$ may be arranged without any overlap with respect to the fixed post $16_1$ to $16_8$ associated with the MEMS. Alternatively, an overlap may be obtained, which may involve a large weight of the movable element and/or short spring elements. The array rows $56_1$ to $56_4$ and/or the array columns $58_1$ to $58_4$ may be arranged in parallel with one another and may be arranged with or without an offset in the row or column directions. Irrespectively of this, but also in combination with one another, some, several or all of the functional elements 28 may have recesses 62, which are adapted to the fixed post of the MEMS of the directly adjacent array row and/or array column.

The functional elements 28 of the MEMS may each form one pixel, so that the array has a multitude of pixels. Pixels of the multitude of pixels may be repeated with a pixel pitch 63. A spring length 65 along an axial extension direction x of the first spring element 24 and/or of the second spring element 26 may be larger than the pixel pitch since the pixel pitch may be small due to a small distance of the pixels along x but due to lateral displacement along y. Such an arrangement may also be referred to as an interleaved arrangement. The recess of the electrode $42_2$ that is explained in FIG. 2 may also be formed to be adapted to the post 16 of a MEMS of a different array row or array column.

According to an embodiment, the functional elements $28_1$ to $28_8$ are formed to jut into the substrate plane projected along the x direction and the y direction beyond the posts $22_1$ to $22_8$. According to an embodiment, the posts 16 are arranged outside the projection of the functional element mechanically connected thereto into the substrate plane 14, so that the spring elements may be longer than the mirrors.

Although the arrays of FIGS. 8a to 8c are shown such that the MEMS are identically formed and identically oriented, the inventive embodiments are not limited to this. Rather, the MEMS may also be differently oriented and/or formed, for example for function individualization, even if this reduces a possibly high area efficiency.

In other words, it may be advantageous for particularly large deflections, as compared to the lateral actuator dimensions, if the springs protrude over the actuator. In order to still obtain a dense arrangement of many such actuators, e.g. in the array 80c, the springs of adjacent actuators may be arranged to be offset, as shown in FIG. 8c. FIG. 8c shows a dense array of many micromirrors arranged with long springs in an offset arrangement. The actuator plates may be cut out accordingly to leave space for the fixed posts.

Embodiments make it possible to asymmetrically suspend MEMS actuators at only one post in order to still achieve tilt-free, parallel deflection. Nevertheless, embodiments provide for the supporting arrangement of further fixed posts. As compared to known solutions, the tilt of the actuator remains small even in case of undesired, asymmetrical force effects. Thus, the space, which often is very limited (especially with very small pixel sizes), may be optimally used for soft suspension. By avoiding stress stiffening, which easily occurs in the case of suspension at several posts, the range of the linear spring characteristic curve (Hook's law) may be particularly large.

Embodiments are suitable, among others, for micromechanical actuators, especially for spatial light modulators (SLM) with very small pixels (measured in terms of the producible mechanical structural sizes or the desired deflection). Such SLMs are particularly interesting for digital holography, both for holographic displays and for applications such as universal laser tweezers, wavefront modeling and fast optical switches for fiber optic networks, where such SLMs allow simultaneous splitting and control of the direction, divergence and intensity of laser beams. However, they may also be used in other pattern generation devices. In addition, many other applications in microactuator systems (also without micromirrors) as well as in sensor technology are possible. Embodiments are related to translatory actuators, especially those coupled to micromirrors for phase adjustment of light reflected from them. One of the tasks achieved with embodiments shown here is to design springs and posts such that the actuator is guided in a purely translational movement while yielding only to a minimum degree to disturbing tilting influences around all axes. On the other hand, the smallest possible forces in the desired direction of movement are to cause the deflections sought for. There typically is no electrical connection between the actuators of the adjacent pixels in order to be able to adjust them individually. This requirement may be partially omitted if group by group control is desired. On the other hand, it is desirable that the micromirrors mechanically coupled to the individual actuators are at a common electrical potential in order to exclude electrostatic forces between neighboring mirrors, which might otherwise lead to deviations in the desired deflections (cross-talk).

Although some aspects have been described in connection with a device, it shall be understood that these aspects also represent a description of the corresponding method, so that a block or component of a device is also to be understood as a corresponding method step or as a feature of a method step. Similarly, aspects described in connection with or as a method step also represent a description of a corresponding block or detail or feature of a corresponding device.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as Including all such alterations, permutations and equivalents as fall within the true spirit and scope of the present invention.

LITERATURE

[1] Peter Dürr, Andreas Gehner, Jan Schmidt, Detlef Kunze, Michael Wagner, Hubert Lakner: 'Micro-actuator with extended analog deflection at low drive voltage', Proceedings of SPIE Vol. 6114 (2006)

[2] Andreas Gehner et al.: 'MEMS analog light processing—an enabling technology for adaptive optical phase control', Proc. of SPIE Vol. 6113, 61130K, (2006)

[3] D. Lopez et al.: 'Two-dimensional MEMS array for maskless lithography and wavefront modulation', Proc. of SPIE Vol. 6589, 65890S, (2007)

[4] Rainer Willing et al.: 'Drehratesensor', Patentanmeldung DE10108198

[5] Larry Hornbeck: 'Spatial Light Modulator and Method', U.S. Pat. No. 4,566,935
[6] Richard Stahl et al.: 'Modular sub-wavelength diffractive light modulator for high-definition holographic displays', Journal of Physics: Conference Series 41 5 (2013) 012057
[7] Peter Dürr et al.: 'MEMS Aktuator, System mit einer Mehrzahl vom MEMS Aktuatoren und Verfahren', Patent DE 102015200626

The invention claimed is:

1. MEMS comprising:
a substrate extending within a substrate plane and comprising a substrate extension that rises above the substrate plane;
a movable structural element;
a first spring element mechanically connecting the movable structural element to the substrate extension; and
a second spring element mechanically connecting the movable structural element to the substrate extension;
the first spring element and the second spring element providing a parallelogram guide of the movable structural element in relation to the substrate extension;
wherein the movable structural element is asymmetrically suspended on one side by means of the parallelogram guide;
wherein the actuator comprises an electrostatic drive;
wherein the electrostatic drive comprises at least one substrate electrode and a movable electrode mechanically connected to the movable structural element, wherein an electric voltage applied between the substrate electrode and the movable electrode causes the deflection of the movable structural element; and
wherein the movable electrode is disposed between the first spring plane and the second spring plane; or wherein the movable electrode is disposed between the first spring plane and the substrate.

2. MEMS as claimed in claim 1, wherein a centroid of the movable structural element in a plan view is arranged outside a foot surface of the substrate extension; or wherein the substrate extension is a first substrate extension and the MEMS comprises a second substrate extension, the movable structural element being asymmetrically suspended on one side via the first and second substrate extensions and a centroid of the movable structural element being arranged, in a plan view, outside a foot surface spanned by the first substrate extension and the second substrate extension.

3. MEMS as claimed in claim 1, wherein the substrate extension is connected to the movable structural element exclusively via the first spring element and the second spring element.

4. MEMS as claimed in claim 1, wherein the first spring element in a force-free state is at least partially disposed within a first spring plane arranged in parallel with the substrate plane, and the second spring element in the force-free state is at least partially disposed within a second spring plane arranged in parallel with the substrate plane and spaced apart from the first spring plane by a plane spacing so as to provide the parallelogram guide.

5. MEMS as claimed in claim 4, wherein the first spring element and the second spring element, upon deflection of the movable structural element along a displacement direction perpendicular to the substrate plane, provide a displacement of the movable structural element along a first direction and a second direction perpendicular to the displacement direction that is the same within a tolerance range of 5% relative to the plane spacing.

6. MEMS as claimed in claim 1, wherein the parallelogram guide is formed such that attachment regions of the first spring element at the substrate extension and at the movable structural element and attachment regions of the second spring element at the substrate extension and at the movable structural element form a parallelogram in a force-free state.

7. MEMS as claimed in claim 1, wherein attachment regions of the first spring element at the substrate extension and the movable structural element and attachment regions of the second spring element at the substrate extension and the movable structural element are arranged within a common plane which is arranged, within a tolerance range of ±10°, perpendicular to the substrate plane.

8. MEMS as claimed in claim 1, wherein the first spring element and the second spring element are congruent in a projection parallel to a direction of movement of the movable structural element within a tolerance range of ±10%.

9. MEMS as claimed in claim 1, wherein the movable structural element is suspended by the first spring element and the second spring element such that the movable structural element may be deflected along a displacement direction within the tolerance range of ±5°, advantageously ±1°, without tilting.

10. MEMS as claimed in claim 1, comprising an actuator configured to cause a deflection of the first spring element and the second spring element.

11. MEMS as claimed in claim 10, wherein a direction of movement of the movement of the movable structural element that is caused by the deflection is arranged in parallel with a thickness direction of the MEMS.

12. MEMS as claimed in claim 1, wherein the at least one substrate electrode is a first substrate electrode and wherein the MEMS comprises a second substrate electrode connected to the substrate or to an immovable structure, the movable electrode being disposed between the first substrate electrode and the second substrate electrode, wherein the first substrate electrode and the second substrate electrode may be individually controlled, in a manner that is specific for each electrode, by an electrical voltage relative to the movable electrode.

13. MEMS as claimed in claim 11, wherein the actuator comprises at least one of an electrostatic comb drive and/or a magnetic actuator.

14. MEMS as claimed in claim 1, wherein the substrate extension is formed as a post structure comprising a cross section with an aspect ratio of two arbitrary lateral directions of expansion, the aspect ratio comprising a value of at least 0.1 and at most 10.

15. MEMS as claimed in claim 1, wherein the movable structural element comprises a functional element which is movable relative to the substrate on the basis of movement of the movable structural element.

16. MEMS as claimed in claim 1, wherein the movable structural element is suspended exclusively via the substrate extension; and the movable structural element comprises a functional element; and wherein the substrate extension is arranged to be laterally offset from a centroid of a surface of a functional element in parallel with the substrate.

17. MEMS as claimed in claim 1, wherein the first spring element and/or the second spring element are formed to be straight at least in sections.

18. MEMS as claimed in claim 1, wherein the first spring element and/or the second spring element in a central region comprises a stiffening with respect to outer regions or is formed as a solid state joint.

19. MEMS as claimed in claim 1, wherein the first spring element and/or the second spring element are formed to comprise a first spring segment and a second spring segment that are connected to a third spring segment, the third spring segment being mechanically connected to the movable structural member, the first spring segment and the second spring segment being mechanically connected to the substrate extension and to the third spring segment.

20. MEMS as claimed in claim 1, further comprising at least a third spring element disposed between the movable structural element and the substrate and within the first or second spring planes.

21. MEMS as claimed in claim 20, wherein the third spring element comprises an angle of more than 0° and at most 120° in relation to the first spring element when projected into the substrate plane.

22. MEMS as claimed in claim 20, wherein the third spring element is disposed within the first spring plane, the MEMS comprising a fourth spring element disposed within the second spring plane and connecting the movable structural element to the substrate.

23. MEMS as claimed in claim 20, wherein the substrate extension is a first substrate extension, wherein the at least third spring element is arranged between the movable structural element and a second substrate extension connected to the substrate.

24. MEMS as claimed in claim 1, wherein the movable structural element comprises a functional element; and wherein the substrate extension is laterally offset from a centroid of a surface of a functional element parallel to the substrate.

25. MEMS as claimed in claim 1, wherein the movable structural element comprises a functional element; and wherein the functional element comprises a mirror.

26. MEMS as claimed in claim 1, wherein the movable structural element is formed to be electrically insulating at least in regions so as to electrically insulate the first spring element and the second spring element from each other.

27. MEMS as claimed in claim 1, wherein a respective stiffness of the first spring element and of the second spring element along a direction parallel to the substrate plane is greater than a stiffness along the displacement direction by a factor of at least 5.

28. Array comprising a multitude of MEMS comprising:
    a substrate extending within a substrate plane and comprising a substrate extension that rises above the substrate plane;
    a movable structural element;
    a first spring element mechanically connecting the movable structural element to the substrate extension; and
    a second spring element mechanically connecting the movable structural element to the substrate extension;
    the first spring element and the second spring element providing a parallelogram guide of the movable structural element in relation to the substrate extension;
    wherein the movable structural element is asymmetrically suspended on one side by means of the parallelogram guide;
    wherein the actuator comprises an electrostatic drive;
    wherein the electrostatic drive comprises at least one substrate electrode and a movable electrode mechanically connected to the movable structural element, wherein an electric voltage applied between the substrate electrode and the movable electrode causes the deflection of the movable structural element; and
    wherein the movable electrode is disposed between the first spring plane and the second spring plane; or wherein the movable electrode is disposed between the first spring plane and the substrate.

29. Array as claimed in claim 28, wherein the plurality of MEMS are arranged in accordance with a polygonal pattern.

30. Array as claimed in claim 28, wherein the multitude of MEMS are arranged in a plurality of parallel array rows, wherein MEMS of a first array row and of an immediately adjacent second array row are arranged to be offset from one another.

31. Array as claimed in claim 28, wherein an electrode of a MEMS comprises a recess adapted to the substrate extension of a MEMS of an adjacent array row.

32. Array as claimed in claim 28, wherein the plurality of MEMS may be controlled individually or in groups with respect to a deflection of the movable structural elements.

33. Array as claimed in claim 28, wherein the multitude of MEMS are arranged in a plurality of array rows parallel to a row extension direction, wherein MEMS of directly adjacent rows are offset from one another with respect to a column direction;
    wherein the first and second spring elements of the multitude of MEMS are arranged in parallel with the row extension direction;
    wherein functional elements connected to the movable structural elements of a respective MEMS are free of overlap with respect to the associated substrate extensions of the MEMS;
    wherein the electrodes connected to the movable structural elements of the respective MEMS comprise a recess which is adapted to the substrate extension of a MEMS of the directly adjacent array row.

34. Array as claimed in claim 28, wherein functional elements connected to the movable structural elements comprise an area density of at least 80% when projected in parallel with a direction of movement of the movable structural elements.

35. Array as claimed in claim 28, wherein functional elements of the plurality of MEMS that are connected to the movable structural elements each form one pixel of a multitude of pixels, wherein pixels of the multitude of pixels are repeated with a pixel pitch, wherein a spring length along an axial extension direction of the first spring element and/or of the second spring element is larger than the pixel pitch.

36. Array comprising a multitude of MEMS, each MEMS comprising:
    a substrate extending within a substrate plane and comprising a substrate extension that rises above the substrate plane;
    a movable structural element;
    a first spring element mechanically connecting the movable structural element to the substrate extension;
    a second spring element mechanically connecting the movable structural element to the substrate extension;
    the first spring element and the second spring element providing a parallelogram guide of the movable structural element in relation to the substrate extension and for a movement of the movable structural element along a displacement direction perpendicular to the substrate plane;
    wherein the multitude of MEMS are arranged in a plurality of array rows parallel to a row extension direction, wherein MEMS of directly adjacent rows are offset with respect to a column direction;
    wherein the first and second spring elements of the multitude of MEMS are arranged in parallel with the row extension direction;

wherein functional elements connected to the movable structural elements of a respective MEMS are free of overlap with respect to the associated substrate extensions of the MEMS; and wherein the electrodes connected to the movable structural elements of the respective MEMS comprise a recess which is adapted to the substrate extension of a MEMS of the directly adjacent array row.

\* \* \* \* \*